United States Patent
Rouaissia et al.

(10) Patent No.: US 9,582,111 B2
(45) Date of Patent: Feb. 28, 2017

(54) METHOD AND DEVICE FOR IMPROVED ACCURACY OF PROXIMITY AND TOUCH DETECTION IN MOBILE DEVICES

(71) Applicant: Semtech Corporation, Camarillo, CA (US)

(72) Inventors: Chaouki Rouaissia, Neuchatel (CH); Jerald G. Ott, III, Escondido, CA (US)

(73) Assignee: Semtech Corporation, Camarillo, CA (US)

(*) Notice: Subject to any disclaimer, the term of this patent is extended or adjusted under 35 U.S.C. 154(b) by 111 days.

(21) Appl. No.: 14/530,112

(22) Filed: Oct. 31, 2014

(65) Prior Publication Data

US 2016/0124573 A1    May 5, 2016

(51) Int. Cl.
    *G09G 5/00*    (2006.01)
    *G06F 3/041*   (2006.01)
    (Continued)

(52) U.S. Cl.
    CPC ............ *G06F 3/0418* (2013.01); *G06F 3/044* (2013.01); *H03K 17/955* (2013.01);
    (Continued)

(58) Field of Classification Search
    CPC .......... G06F 2203/04107; G06F 3/044; H01Q 1/243; H01Q 1/44; H01Q 9/42;
    (Continued)

(56) References Cited

U.S. PATENT DOCUMENTS 8,775,103 B1*   7/2014   Jayaraj ................. H03K 17/955
                                                      702/57
2008/0047764 A1*  2/2008   Lee ....................... G08C 21/00
                                                     178/18.06
(Continued)

FOREIGN PATENT DOCUMENTS

EP        2429078 A1    3/2012

OTHER PUBLICATIONS

Analog Devices, Inc., "24-Bit Capacitance-to-Digital Converter with Temperature Sensor", pp. 1-28, 2007.
(Continued)

*Primary Examiner* — Jennifer Nguyen
(74) *Attorney, Agent, or Firm* — Brian M. Kaufman; Robert D. Atkins; Atkins and Associates, P.C.

(57) ABSTRACT

A mobile device has a proximity sensor. A compensation value of the proximity sensor is determined. The compensation value is compared to a reference compensation value to determine validity of the compensation value. A capacitance of the proximity sensor is measured. A value of the capacitance of the proximity sensor is adjusted based on the compensation value. A coefficient defining a relationship between a capacitance of the proximity sensor and a temperature of the mobile device is calculated. A temperature sensor is coupled to the proximity sensor. The temperature of the mobile device is measured. A value of the capacitance of the proximity sensor is adjusted based on the coefficient and the temperature of the mobile device. The adjusted capacitance value is compared to a threshold capacitance (Continued)

value to determine proximity of an object to the mobile device. A radio frequency signal is adjusted by detecting proximity.

22 Claims, 9 Drawing Sheets

(51) Int. Cl.
  *G06F 3/044* (2006.01)
  *H03K 17/955* (2006.01)
(52) U.S. Cl.
  CPC .............. *G06F 2203/04107* (2013.01); *G06F 2203/04108* (2013.01); *H03K 2217/94015* (2013.01); *H03K 2217/94031* (2013.01); *H03K 2217/960705* (2013.01)
(58) Field of Classification Search
  CPC ..... H03K 17/955; H03K 2217/960755; H03K 2017/9606; H04B 1/0053; H04B 1/3838; H04B 15/00; H04W 52/243; H04W 52/283; H04W 88/06
  USPC .............. 345/174; 455/556.1, 556.2, 566, 77
  See application file for complete search history.

(56) References Cited

U.S. PATENT DOCUMENTS

| | | |
|---|---|---|
| 2009/0260898 A1 | 10/2009 | Jin et al. |
| 2010/0317302 A1 | 12/2010 | Greenwood et al. |
| 2013/0328822 A1 | 12/2013 | Luo et al. |
| 2014/0021331 A1* | 1/2014 | Chang .................... G01V 8/10 250/206 |

OTHER PUBLICATIONS

Cypress Semiconductor, "PSoC 4 Capsense Design Guide", pp. 1-101, Apr. 19, 2013.
Semtech Corporation, "Wireless & Sensing", pp. 1-39, Feb. 5, 2014.

* cited by examiner

METHOD AND DEVICE FOR IMPROVED ACCURACY OF PROXIMITY AND TOUCH DETECTION IN MOBILE DEVICES

FIELD OF THE INVENTION

The present invention relates in general to sensors and, more particularly, to a method and device for improved accuracy of proximity and touch detection in mobile devices.

BACKGROUND OF THE INVENTION

Smartphones and other mobile devices have rapidly become ubiquitous throughout the world. Mobile phones and tablet computers are commonly seen in use at restaurants, in waiting rooms, or on street corners. Mobile devices are used for gaming, photography, listening to music, social networking, or simply talking with another person via a built in microphone and speaker.

Mobile devices enrich lives by keeping family and friends in communication, allowing any moment to be captured as a photo or video, and providing a means of contacting someone in an emergency situation. At the same time, mobile devices pose certain dangers to users. Accidents occur when a driver is distracted by an incoming text message or ongoing phone call. Pedestrians are injured or killed due to paying closer attention to a mobile device than to nearby traffic. In addition, the potential exists that radiation emanating from a mobile device will be absorbed by a human body and cause damage to the health of a user.

FIG. 1a illustrates a mobile device 10. Mobile device 10 is a touchscreen slate cellular (cell) phone. In other embodiments, mobile device 10 is a tablet computer, pager, GPS receiver, smartwatch or other wearable computer, laptop computer, handheld game console, or any other device capable of radio communication.

Mobile device 10 includes touchscreen 12 on a front side of the mobile device. Touchscreen 12 is used to display a graphical user interface (GUI). The GUI on touchscreen 12 presents feedback, notifications, and other information to a user as determined by an operating system of mobile device 10. Touchscreen 12 is sensitive to physical touch from body parts of a user of mobile device 10. Touchscreen 12 utilizes resistance, capacitance, acoustic waves, an infrared grid, optical imaging, or other methods to determine the presence and location of a user's touch.

In one common usage scenario of mobile device 10, touchscreen 12 displays a button as a part of the GUI, and a user touches the location of the button on the touchscreen to perform an action associated with the button. In one embodiment, touchscreen 12 displays a 3×4 telephone keypad. A user dials a telephone number on the displayed keypad by touching touchscreen 12 at the locations where the desired numbers to dial are displayed. Touchscreen 12 displays an alphanumeric or other keyboard along with, or as an alternative to, the telephone keypad, with a user touching the touchscreen in the location of letters, numbers, or symbols to be entered in a text input field displayed on the touchscreen. Touchscreen 12 is also used to watch downloaded or streamed videos, or play games, with a user's touch controlling playback of the video or play of the game. In some embodiments, touchscreen 12 is sensitive to a user's touch when the display component of the touchscreen is disabled. While listening to music, a user pauses the music, or advances to the next track of music, by drawing a symbol on touchscreen 12 even though nothing is displayed on the touchscreen.

Buttons 14 provide an alternative user input mechanism to touchscreen 12. Buttons 14 perform functionality depending on the programming of the operating system running on mobile device 10. In one embodiment, buttons 14 return the GUI on touchscreen 12 to a home screen, go back to a previous GUI screen, or open up a menu on the GUI. In other embodiments, the functionality of buttons 14 changes based on a context displayed on touchscreen 12.

Speaker 16 provides audible feedback to a user of mobile device 10. When mobile device 10 receives an incoming message, speaker 16 produces an audible notification sound to alert a user to the received message. An incoming telephone call causes a ringing sound from speaker 16 to alert the user. In other embodiments, a musical ringtone, selectable via the GUI on touchscreen 12, is played via speaker 16 when an incoming telephone call is received. When mobile device 10 is used to participate in a telephone call, a user of the mobile device speaks into microphone 17 while the other conversation participants' voices are reproduced by speaker 16. When a user watches a movie or plays a game, the sound associated with the movie or game is produced by speaker 16 for the user to hear.

Front facing camera 18 provides visual feedback to the operating system of mobile device 10. Camera 18 creates a digital image of the area facing touchscreen 12. Camera 18 is used in video chat applications running on mobile device 10 to capture video of a user's face during a conversation. Mobile device 10 transmits the video of a user to another mobile device in another location, and receives a streaming video of another person using the other mobile device which is displayed on touchscreen 12. Camera 18 is also used to take selfies or other pictures. When camera 18 is used to take pictures, touchscreen 12 displays the image being captured by the camera so that the touchscreen is an electronic viewfinder. Captured photographs are stored on memory within mobile device 10 for subsequent viewing on touchscreen 12, sharing on social networks, or backing up to a personal computer.

Housing 20 provides structural support and protection for the internal components of mobile device 10. Housing 20 is made of rigid plastic or metallic materials to withstand environmental hazards which cause harm to the circuit boards and other components within mobile device 10 if exposed directly. In one embodiment, a panel of housing 20 opposite touchscreen 12 is removable to expose interchangeable parts of mobile device 10 such as a subscriber identification module (SIM) card, flash memory card, or battery. Housing 20 includes a transparent glass or plastic portion over touchscreen 12, which protects the touchscreen from environmental factors while allowing a user's touch to be sensed through the housing.

FIG. 1b illustrates a user 30 operating mobile device 10 as a telephone. A portion of housing 20 is removed to illustrate antenna 32 within mobile device 10. User 30 holds mobile device 10 with speaker 16 over an ear of the user. Microphone 17 is oriented toward a mouth of user 30. When user 30 speaks, microphone 17 detects and digitizes the user's voice for transmission to a person the user is speaking with. The person that user 30 is speaking with transmits a digitized voice signal to mobile device 10 which is reproduced on speaker 16 and heard by the user. User 30 thereby converses with another person using mobile device 10.

Mobile device 10 sends a voice signal of user 30, and receives a voice signal of a person being conversed with, using a cellular network or other network capable of voice traffic. In various embodiments, mobile device 10 transmits voice signals and other data over Wi-Fi, Bluetooth, GSM, CDMA, LTE, HSPA+, WiMAX, or other wireless network types. Mobile device 10 transmits a voice signal using radio frequency (RF) electromagnetic waves emanating from RF antenna 32. An RF amplifier in mobile device 10 supplies an electric current, which contains the voice information and oscillates at radio frequencies, to antenna 32. Antenna 32 radiates energy of the current as electromagnetic waves through the surrounding atmosphere. The electromagnetic waves reach a cellular tower which forwards the voice signal on to ultimately be received by the person that user 30 is conversing with.

FIG. 1c is a block diagram of an RF section 33 of mobile device 10. RF section 33 represents a portion of the circuitry located on a circuit board within mobile device 10. RF section 33 includes microcontroller or central processing unit (CPU) 34, RF transceiver 36, RF amplifier 38, and antenna 32. For mobile device 10 to receive an audio signal or other digital data, radio waves are first received by antenna 32. Oscillating electric and magnetic fields of an incoming radio wave exert force on electrons in antenna 32, causing the electrons to oscillate and creating a current in the antenna. RF transceiver 36 demodulates the incoming signal to eliminate RF frequencies and sends the underlying data to CPU 34.

When mobile device 10 is transmitting data, CPU 34 first provides data to be transmitted. In one embodiment, CPU 34 receives audio data from microphone 17 and performs digital signal processing functions on the audio data. CPU 34 performs any digital signal processing or baseband processing required for the audio data, or a separate digital signal processor (DSP) or baseband integrated circuit (IC) is used. In other embodiments, non-voice data is sent, e.g., an outgoing text message or a uniform resource locator (URL) of a website which user 30 wishes to view on touchscreen 12. Once CPU 34 has received or generated the data to be transmitted, the data is sent from the CPU to RF transceiver 36. RF transceiver 36 generates an RF signal containing the data to be transmitted by modulating the data using the frequency for a network that mobile device 10 is communicating with.

The RF signal is sent from RF transceiver 36 to RF amplifier 38. RF amplifier 38 amplifies the signal from RF transceiver 36 to generate a higher power RF signal for transmission by antenna 32. RF amplifier 38 sends the amplified RF signal to antenna 32. The amplified RF signal causes an oscillating current of electrons within antenna 32. The oscillating electric current creates an oscillating magnetic field around antenna 32 and an oscillating electric field along the antenna. The time-varying electric and magnetic fields radiate away from antenna 32 into the surrounding environment as an RF electromagnetic wave.

The output power of RF amplifier 38 is controlled by CPU 34. CPU 34 controls the strength of an RF signal emanating from antenna 32 by configuring a gain setting of RF amplifier 38. A device receiving radio waves from mobile device 10 can be from a few feet away for in-home Wi-Fi, to a few miles away for rural cellular service, or potentially even further away from the mobile device. A higher gain setting of RF amplifier 38 causes a higher power electromagnetic radio wave to emanate from mobile device 10. A higher power electromagnetic radio wave is received at a location further away from mobile device 10.

Antenna 32 is omnidirectional, i.e., the antenna radiates energy approximately equally in every direction from mobile device 10. An omnidirectional antenna 32 gives mobile device 10 good connectivity with a cellular tower without regard to the angle the mobile device is held at. However, due to the omnidirectional nature of antenna 32, a significant amount of RF electromagnetic radiation from the antenna is radiated into user 30 when the user holds the mobile device near a body part, as illustrated in FIG. 1b. Some health concerns exist in relation to RF radiation from mobile devices, such as mobile device 10, being absorbed by the human body. Some studies suggest that RF energy absorbed by the body may be linked to cancer and other illnesses.

Specific absorption rate (SAR) is a measure of the rate at which energy is absorbed by the human body when exposed to an RF electromagnetic field. SAR measures exposure to electromagnetic fields between 100 kHz and 10 GHz. A SAR rating is commonly used in association with cell phones and magnetic resonance imaging (MRI) scanners.

When measuring SAR due to mobile device 10, the mobile device is placed at the head in a talk position, as illustrated in FIG. 1b. The SAR value is then measured at the location that has the highest absorption rate in the entire head, which is generally the closest portion of the head to antenna 32. In the United States, the Federal Communications Commission (FCC) requires that mobile devices have a SAR level at or below 1.6 watts per kilogram (W/kg) taken over the volume containing a mass of 1 gram of tissue that is absorbing the most RF energy. In Europe, the European Committee for Electrotechnical Standardization (CENELEC) specifies a SAR limit of 2 W/kg averaged over the 10 grams of tissue absorbing the most RF energy.

Regulations limiting the SAR from mobile device 10 in effect limit the RF power of the mobile device when in use near the body of user 30. Limiting RF output limits signal strength and can degrade connectivity of mobile device 10 to cell phone towers. FIGS. 2a-2c show graphs of SAR versus the distance of mobile device 10 from user 30. In FIGS. 2a and 2b, RF amplifier 38 has a constant power output. In FIG. 2a, CPU 34 has configured RF amplifier 38 for high RF power and good connectivity of mobile device 10 to cell phone towers. Line 40 illustrates that with a constant RF power output, SAR is reduced as mobile device 10 is moved further away from user 30, i.e., further right on the graph in FIG. 2a. As mobile device 10 is moved closer to user 30, SAR increases.

Radiation emanating from mobile device 10 attenuates as the radiation travels further away from antenna 32. When mobile device 10 is directly next to the head of user 30, much of the radiation emanating from antenna 32 is concentrated on a small area of the head, resulting in a high SAR. When mobile device 10 is further away from user 30, radiation spreads out and hits a larger area of the user's body at a lower energy level. Much of the radiation which hits user 30 when mobile device 10 is held up to the head will miss the user when the mobile device is held at a distance.

Line 40 shows that when configured for high RF power and good connectivity, mobile device 10 will exceed SAR regulatory limit 42 when the mobile device is held within a distance d of a body part of user 30. In one embodiment, the distance d at which mobile device 10 exceeds SAR regulatory limit 42 when configured for high power output is 10 millimeters (mm). Mobile device 10 as configured in FIG. 2a includes good connectivity but is out of compliance with SAR regulations.

One solution to ensure that the SAR of mobile device 10 remains under regulatory limit 42 is to reduce the RF output power of the mobile device, illustrated by FIG. 2b. Line 44 shows that as mobile device 10 is moved further away from user 30, SAR is reduced, as with the configuration of FIG. 2a. However, in FIG. 2b, mobile device 10 is configured for a lower RF output, and does not exceed SAR regulatory limit 42 when the mobile device is held against user 30. The lower RF output makes mobile device 10 in compliance with SAR regulations, but reduces connectivity of the mobile device.

FIG. 2c illustrates another solution to maintaining the SAR of mobile device 10 under regulatory limit 42. When mobile device 10 is held at a distance greater than d from user 30, RF power output of the mobile device, illustrated by line 46, is at a level similar to the higher power setting illustrated in FIG. 2a. When mobile device 10 is moved within a distance d of user 30, i.e., the distance at which SAR would exceed regulatory limit 42 in the configuration of FIG. 2a, the RF output of the mobile device is reduced to remain under the regulatory limit. The reduced RF output within distance d is illustrated by line 48, which is similar to line 44 of FIG. 2b. As configured in FIG. 2c, mobile device 10 includes good connectivity when held a distance greater than d from user 30, and a reduced RF output to remain under SAR regulatory limit 42 when held within a distance d of the user.

To implement the configuration illustrated in FIG. 2c, mobile device 10 includes a proximity sensor used to detect distance from user 30. When the proximity sensor detects user 30 is within a distance d of the proximity sensor, CPU 34 reduces the RF power output of RF amplifier 38 to prevent the SAR of mobile device 10 from rising above regulatory limit 42. When the proximity sensor detects no human body within a distance d of mobile device 10, CPU 34 increases RF power output to improve connectivity.

One goal of mobile device manufacturers is to improve the accuracy of proximity sensors. Inaccurate proximity readings result in a high power mode of mobile device 10 being enabled within a distance d of user 30, in violation of SAR regulations. Inaccurate proximity readings also result in a low power mode of mobile device 10 being enabled outside a distance d of user 30, resulting in an unnecessary degradation of connectivity. An accurate proximity sensor provides for an immediate decrease of RF power output when a mobile device is moved within a distance d of a human body, and an immediate increase of RF power output when the mobile device is moved outside of a distance d of the human body.

A number of challenges exist to producing an accurate proximity reading in mobile devices. A capacitive touch sensor must be properly calibrated to ignore the detected capacitance of the environment, and report only the capacitance resulting from a nearby human body. Calibration of capacitive touch sensors is a challenge because the environmental capacitance changes with temperature and humidity, among other factors. In addition, if calibration occurs while a body part is within proximity of the sensor, the sensor includes the human body in the ignored environmental capacitance. Cancelling a portion of the capacitance attributable to a user in proximity to a mobile device reduces the sensitivity of a proximity sensor, potentially preventing proximity from being detected.

SUMMARY OF THE INVENTION

A need exists to improve the accuracy of proximity and touch detection in mobile devices. Accordingly, in one embodiment, the present invention is a method of detecting proximity comprising the steps of providing a mobile device including a proximity sensor, determining a compensation value of the proximity sensor, and comparing the compensation value to a reference compensation value to determine validity of the compensation value.

In another embodiment, the present invention is a method of detecting proximity comprising the steps of providing a mobile device including a proximity sensor, determining a compensation value of the proximity sensor, and determining validity of the compensation value.

In another embodiment, the present invention is a method of detecting proximity, comprising the steps of providing a proximity sensor, and determining a reference compensation value of the proximity sensor.

In another embodiment, the present invention is a proximity sensor comprising a reference compensation value of the proximity sensor. A comparator compares a second compensation value to the reference compensation value.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1A:
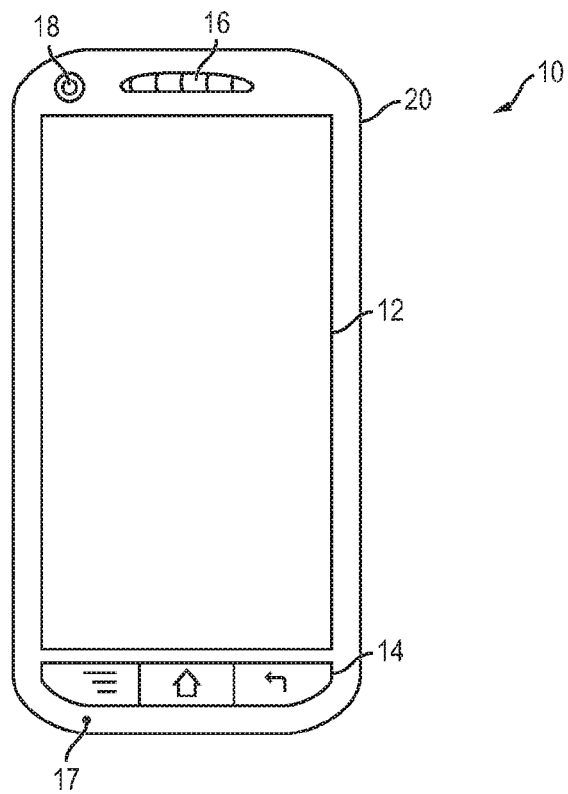
FIGS. 1a-1c illustrate a mobile device with RF transmission capability.
Figure 1B:
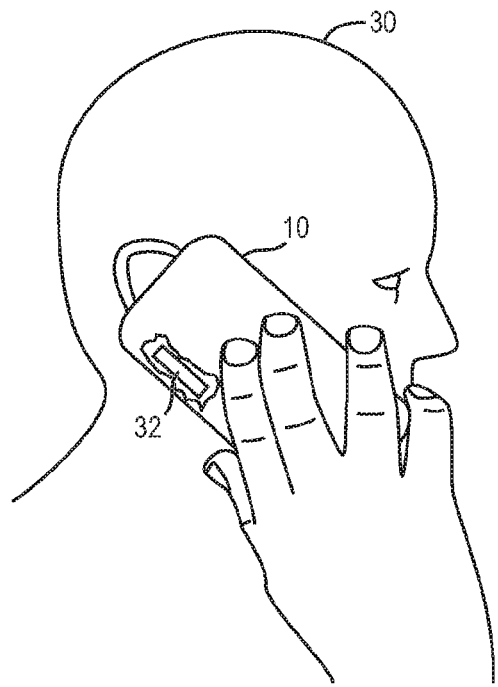
Figure 1C:
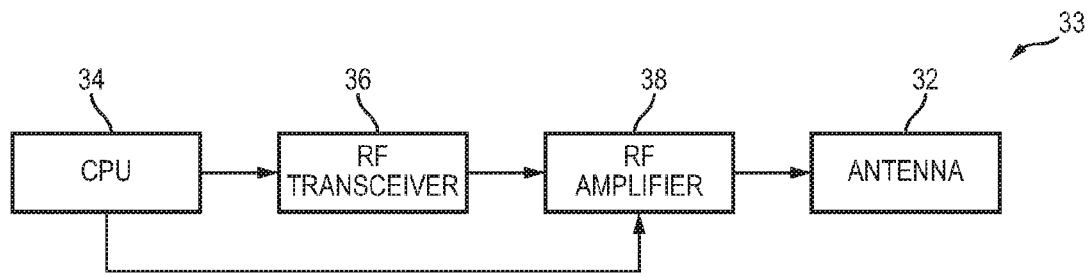
Figure 2A:
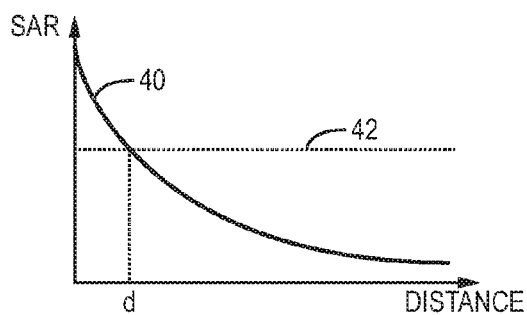
FIGS. 2a-2c illustrate SAR versus distance from a human body for a mobile device with and without the use of a proximity sensor.
Figure 2B:
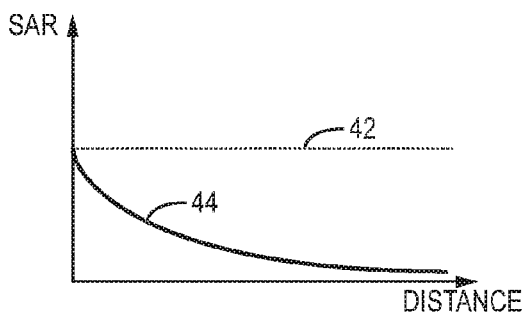
Figure 2C:
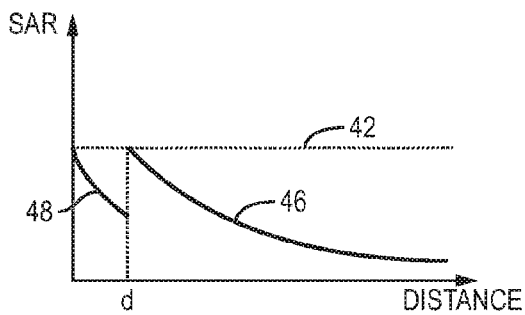
Figure 3A:
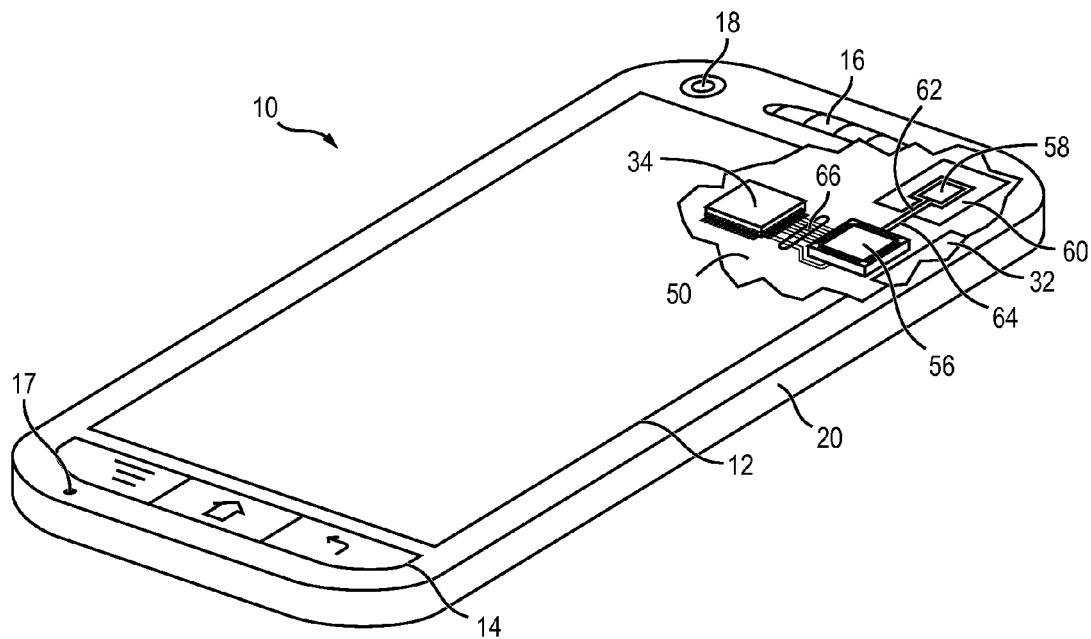
FIGS. 3a-3b illustrate a mobile device including a proximity sensor.

FIG. 3a illustrates mobile device 10 with a portion of touchscreen 12 and housing 20 removed to reveal printed circuit board (PCB) 50 with CPU 34, capacitive touch controller 56, sensing element 58, and shielding area 60 formed or disposed on the PCB. In other embodiments, a flexible printed circuit (FPC) is used instead of PCB 50.

Capacitive touch controller 56 and sensing element 58 form a proximity sensor for mobile device 10. In some embodiments, proximity sensors are used which do not require a separate sensing element. Conductive trace 62 connects sensing element 58 to capacitive touch controller 56, while conductive trace 64 connects shielding area 60 to the capacitive touch controller. Conductive traces 66 provide communication between CPU 34 and capacitive touch controller 56.

PCB 50 provides a base for mounting the electronic parts and forming the conductive traces necessary to provide the functionality of mobile device 10. PCB 50 includes other circuit elements and semiconductor packages not illustrated as required to implement the functionality of mobile device 10. PCB 50 includes all the electronic parts necessary for mobile device 10. In other embodiments, the electronic parts for mobile device 10 are split across multiple PCBs. PCB 50 includes additional parts such as a Universal Serial Bus (USB) port, random access memory (RAM), flash memory, a graphics processing unit (GPU), or a system on a chip (SoC).

Capacitive touch controller 56 is an IC designed to measure the self-capacitance, or inherent capacitance, of sensing element 58. Self-capacitance is a capacitance measured between a conductive element, e.g., sensing element 58, and a ground potential. When the conductive object to be detected, e.g., a lap, finger, palm, or face of user 30, is not present near sensing element 58, the self-capacitance of the sensing element, Csensor, is the environmental capacitance, Cenv. Cenv is determined by electric fields from sensing element 58 interacting with the environment near the sensing element. In particular, electric fields from sensing element 58 interact with nearby conductive material such as shielding area 60, traces 62-66, power and ground planes, conductive vias, and ICs. When a body part of user 30 is present near sensing element 58, the self-capacitance of the sensing element, Csensor, is Cenv plus the capacitance attributable to the body part, Cuser. Capacitive touch controller 56 is calibrated with the value of Cenv, via a process explained in detail below, and subtracts Cenv from the total self-capacitance of sensing element 58. The remaining capacitance is the self-capacitance attributable to a body part of user 30 in proximity of sensing element 58, i.e., Cuser. In practice, a configurable capacitor bank within capacitive touch controller 56 cancels or counteracts the Cenv contribution to self-capacitance, leaving Cuser to be measured, although other methods of isolating Cuser from Csensor are used in other embodiments.

If Cuser, i.e., the measured self-capacitance of sensing element 58 attributable to user 30, is approximately equal to zero, capacitive touch controller 56 reports to CPU 34 a lack, or absence, of proximity via a memory mapped flag, as well as an interrupt. If Cuser is over a threshold associated with a human body part, capacitive touch controller 56 reports proximity in a similar manner. In addition to a flag indicating proximity or lack thereof, capacitive touch controller 56 reports to CPU 34 a digital value proportional to Cuser for each Cuser measurement, whether proximity is detected or not. CPU 34 uses the proximity flag for simple applications where only proximity or lack of proximity is needed, and uses the digital Cuser value to implement functionality that is more advanced.

Capacitive touch controller 56 senses self-capacitance of sensing element 58 by first using a bank of capacitors to cancel Cenv, and then converting the remaining capacitance, Cuser, to a proportional voltage potential. In some embodiments, the entire self-capacitance of sensing element 58, Csensor, is converted to a proportional voltage and then reduced by a voltage proportional to Cenv. The resulting voltage, proportional to Cuser, is converted to a digital value using an analog to digital converter. The digital Cuser value is processed to determine whether Cuser exceeds a threshold for acknowledging proximity.

Sensing element 58 is a square of copper formed on a surface of PCB 50, although other shapes and other conductive materials are used for the sensing element in other embodiments. In one embodiment, the same physical element is used for both antenna 32 and sensing element 58. In embodiments with a single physical element used for antenna 32 and sensing element 58, a capacitor and inductor are used to filter RF signals from reaching capacitive touch controller 56 and filter lower frequency signals from reaching RF amplifier 38 and RF transceiver 36. In other embodiments, any conductive element is used for sensing element 58.

Sensing element 58 interacts with nearby conductive material, such as conductive traces, vias, and ground planes, as well as a lap, finger, palm, or face of user 30, via electric fields. When a charge is applied to sensing element 58, an opposite charge is attracted toward the sensing element within any nearby conductive material. When the amount of conductive material near sensing element 58 is increased, a greater amount of electric charge is attracted to the sensing element for a given voltage. Thus, the self-capacitance of sensing element 58 is a function of the amount of conductive material near the sensing element. Conductive material having a conduction path to a circuit node at a ground potential has a greater effect on self-capacitance because the ground node provides a source of additional charge into the conductive material. Sensing element 58 attracts opposite charge into nearby conductive material through the ground node.

Shielding area 60 provides an electromagnetic shield substantially surrounding sensing element 58. A shielding area formed on a surface of PCB 50 opposite sensing element 58 and shielding area 60 blocks the sensing element from detecting conductive material on a back side of mobile device 10.

Shielding area 60 is electrically connected to capacitive touch controller 56. Capacitive touch controller 56 drives shielding area 60 with a similar voltage potential as sensing element 58 when measuring self-capacitance of the sensing element. In other embodiments, shielding area 60 is electrically connected to a ground potential. Connecting shielding area 60 to ground potential provides an increase to the Cenv component of self-capacitance of sensing element 58. A higher Cenv requires a larger capacitor bank within capacitive touch controller 56 to counteract the higher Cenv. Driving shielding area 60 with a similar voltage potential as sensing element 58 provides a lower Cenv, and reduces the required size of the capacitor bank within capacitive touch controller 56.

Conductive trace 62 connects sensing element 58 to capacitive touch controller 56. In some embodiments, multiple sensing elements are used, with each sensing element separately connected to capacitive touch controller 56 with a different conductive trace. In one embodiment, sensing elements are used to implement buttons 14, with the buttons being activated when proximity of user 30 is sensed on a button. Capacitive touch controller 56 manipulates the voltage of sensing element 58 and detects the self-capacitance of the sensing element via conductive trace 62. Conductive trace 64 connects shielding area 60 to capacitive touch controller 56. Capacitive touch controller 56 controls the voltage of shielding area 60 to be approximately equal to the voltage of sensing element 58 via conductive trace 64.

Conductive traces 66 connect CPU 34 to capacitive touch controller 56. Traces 66 include lines for reset, interrupt, data, address, clock, enable, and other signals necessary for communication between CPU 34 and capacitive touch controller 56. In one embodiment, CPU 34 communicates with capacitive touch controller 56 using the inter-integrated circuit ($I^2C$) protocol. Other communication protocols are used in other embodiments.

Some functions of capacitive touch controller 56 are controlled by CPU 34 using a single conductive trace 66 connected to a pin on the capacitive touch controller, such as enabling or disabling sensing. Other functionality is exercised by CPU 34 reading from or writing to hardware registers within capacitive touch controller 56. A raw Cuser value is read from a memory mapped hardware register internal to capacitive touch controller 56. A register is also used by CPU 34 to set the threshold value of Cuser when capacitive touch controller 56 reports proximity. Some functionality is implemented with a discrete input or output pin on capacitive touch controller 56, as well as a hardware register within the capacitive touch controller. Capacitive touch controller 56 is reset by CPU 34 toggling a reset input pin of the capacitive touch controller, or by the CPU writing to a soft reset register within the capacitive touch controller.

Figure 3B:
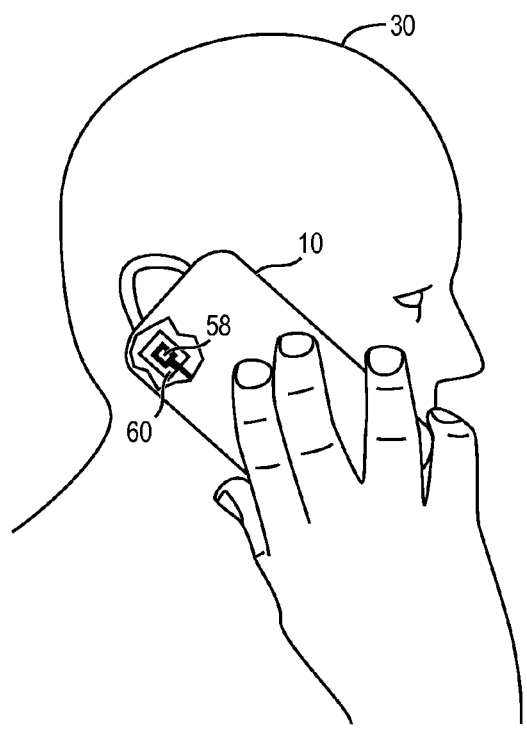

In FIG. 3b, user 30 holds mobile device 10 up to his or her head. The self-capacitance of sensing element 58 increases due to the interaction of electric fields between the sensing element and user 30. Prior to mobile device 10 being disposed in proximity to user 30, the area in front of the mobile device is occupied by air, which has a smaller effect on self-capacitance than the head of the user. Capacitive touch controller 56 detects the rise in self-capacitance of sensing element 58, and notifies CPU 34 of the proximity of user 30. CPU 34 reduces the power output of RF amplifier 38 accordingly so that mobile device 10 remains in compliance with SAR regulations.

Figure 4A:
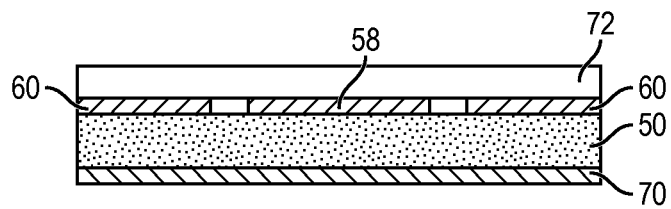
FIGS. 4a-4c illustrate electric fields between a proximity sensing element, surrounding shielding areas, and a human finger.

FIG. 4a is a partial cross-section of PCB 50 illustrating sensing element 58 and shielding area 60 formed on a top surface of the PCB. Shielding area 70 is formed on a bottom surface of PCB 50 opposite sensing element 58 and shielding area 60. An optional overlay 72 is formed over sensing element 58 and shielding area 60 for physical isolation and protection of the sensing element and shielding area.

PCB 50 is formed from one or more layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Electronic components necessary for the functionality of mobile device 10, such as conductive traces and ICs, are formed or disposed on surfaces of PCB 50. In one embodiment, a multilayer PCB 50 is used which includes electronic components on layers between a top and bottom surface of the PCB. Components at different layers of PCB 50 are connected by conductive vias formed in the PCB.

Sensing element 58 and shielding area 60, as well as traces 62-66 are formed as a layer of metal on PCB 50. In one embodiment, sensing element 58, shielding area 60, and traces 62-66 are formed from a single uniform layer of metal using subtractive methods such as silk screen printing, photoengraving, or PCB milling. In other embodiments, an additive or semi-additive method such as physical vapor deposition (PVD), chemical vapor deposition (CVD), electrolytic plating, electroless plating, or another suitable metal deposition process is used. Shielding area 70 is formed from a similar process as sensing element 58 and shielding area 60.

Sensing element 58, shielding area 60, shielding area 70, and conductive traces 62-66 include one or more layers of aluminum (Al), copper (Cu), tin (Sn), nickel (Ni), gold (Au), silver (Ag), indium tin oxide (ITO), printed conductive ink, or other suitable electrically conductive material. Traces 62-66 are formed on the same surface of PCB 50 as sensing element 58. In other embodiments, traces 62-66 are formed on the surface of PCB 50 opposite sensing element 58, or on an intermediate layer when a multilayer PCB is used. Conductive vias are used to connect traces 62-66 to CPU 34, capacitive touch controller 56, sensing element 58, and shielding area 60 when the traces are not formed on the same surface as sensing element 58. A conductive via connects shielding area 60 to shielding area 70 so that capacitive touch controller 56 drives both shielding areas to a similar voltage potential.

Shielding areas 60 and 70 provide a noise blocking function, as well as directionality for sensing element 58. Shielding areas 60 and 70 provide an electromagnetic shield substantially surrounding sensing element 58 in each direction other than the direction which sensing is desired. Electric fields from sensing element 58 interact with shielding areas 60 and 70, which have a stable effect on self-capacitance, instead of other objects opposite the shielding areas which have a dynamic capacitance with respect to the sensing element. Shielding areas 60 and 70 also reduce electromagnetic noise which impacts the accuracy of the detected capacitance.

Figure 4B:
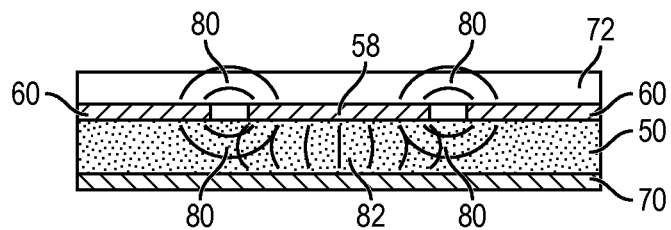
Figure 4C:
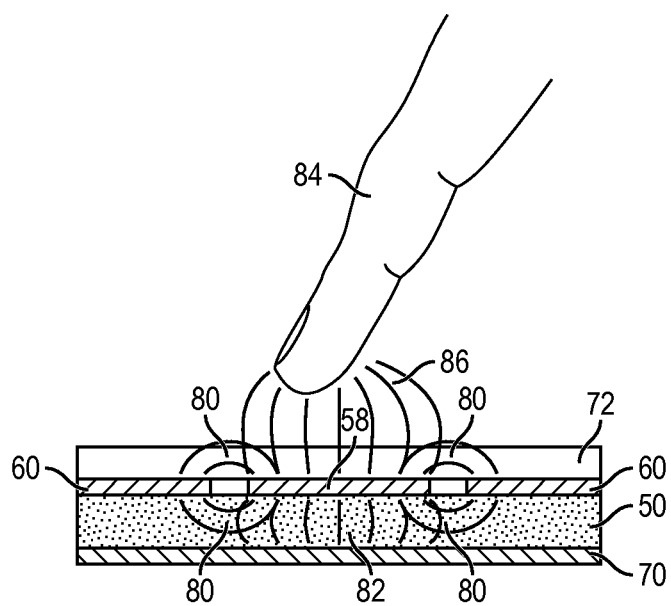

With shielding areas 60 and 70 surrounding sensing element 58 on the bottom and sides, as illustrated in FIGS. 4a-4c, a body part is detected when disposed over sensing element 58 opposite shielding area 70. Shielding area 70 limits the detection capability of capacitive touch controller 56 when a finger or other body part of user 30 is disposed on the back side of PCB 50, i.e., on the opposite side of the PCB from sensing element 58. In some embodiments with an omnidirectional antenna 32, shielding area 70 is not used so that a body part of user 30 is detected whether the body part is on a front or back side of mobile device 10. Without shielding area 70, proximity is detected, and CPU 34 reduces RF power output of mobile device 10, when a body part of user 30 is within proximity on the back side of mobile device 10, e.g., the user sets the mobile device in his or her lap. In other embodiments, neither shielding area 60 nor shielding area 70 is used.

Shielding areas 60 and 70 are electrically connected to capacitive touch controller 56. Capacitive touch controller 56 drives shielding areas 60 and 70 to a similar voltage potential as sensing element 58 when sensing self-capacitance of the sensing element. In other embodiments, shielding areas 60 and 70 are electrically connected to a ground potential. Connecting shielding areas 60 and 70 to ground potential provides an increase to the Cenv component of self-capacitance of sensing element 58 due to ground providing a source of charges attracted to the sensing element. A higher Cenv requires a larger capacitor bank within capacitive touch controller 56 to counteract the higher Cenv. Capacitive touch controller 56 driving shielding areas 60 and 70 to a similar voltage potential as sensing element 58 reduces self-capacitance of sensing element 58 by reducing the amount of charge the sensing element attracts in the shielding areas.

Overlay 72 provides physical isolation and protection for sensing element 58. Overlay 72 increases the robustness of mobile device 10 by protecting sensing element 58 from environmental hazards such as dust, dirt, rain, and wind. In one embodiment, overlay 72 is a sheet of plastic or glass integrated into housing 20. Overlay 72 is translucent, transparent, or opaque. Overlay 72 is formed from a material with an electric field permittivity sufficient to allow electric fields to propagate between sensing element 58 and a body part of user 30 disposed in proximity to the sensing element.

FIG. 4b illustrates electric fields between sensing element 58 and shielding areas 60 and 70 when no human body part is in the proximity of the sensing element. Electric fields 80 extend between sensing element 58 and shielding area 60. Electric fields 82 extend between sensing element 58 and shielding area 70. Electric fields 80 and 82 are simplified illustrations of the electric fields interacting with sensing element 58. In practice, the electric fields are complex and extend not only to shielding areas 60 and 70, but also to any conductive material, such as conductive vias or conductive traces, near sensing element 58. The environmental self-capacitance, Cenv, of sensing element 58 is a measure of electric fields 80 and 82 from the sensing element interacting with shielding areas 60 and 70 and other conductive material in proximity to the sensing element when user 30 is not in proximity.

When a charge exists on sensing element 58, electric fields 80 and 82 attract an opposite charge within shielding areas 60 and 70 toward the sensing element. A negative charge exists when there is an excess of electrons in the atoms of an object compared to the number of protons. A positive charge exists when there is a deficit of electrons compared to the number of protons. Negatively charged material attracts positive charge, and positively charged material attracts negative charge. When a first object has a positive charge, electrons in nearby conductive objects are attracted to the first object, creating an area of negative charge in the nearby objects. When a first object has a negative charge, electrons in nearby conductive objects are repelled, creating an area of positive charge in the nearby objects. A negative charge and a positive charge are opposites.

In FIG. 4c, finger 84 of user 30 is in the proximity of sensing element 58. While a finger is illustrated, a lap, palm, face, or other conductive object is also capable of being detected. Electric fields 86 attract a charge to the tip of finger 84 that is opposite of a charge on sensing element 58. The charge attracted in finger 84 raises the total amount of charge that must be supplied to sensing element 58 by capacitive touch controller 56 to reach a given voltage potential of the sensing element. As charge per volt is a formula defining capacitance, additional conductive material with additional charge attracted to sensing element 58 raises the self-capacitance of the sensing element. In FIG. 4c, Cenv is represented by electric fields 80 and 82, Cuser is represented by electric fields 86, and Csensor is the sum of Cenv and Cuser.

Capacitive touch controller 56 measures that the self-capacitance of sensing element 58, and thus Cuser, has risen. A flag is set within a hardware register of capacitive touch controller 56, and the capacitive touch controller asserts an interrupt signal to CPU 34. CPU 34 receives the interrupt and executes program code associated with a new proximity reading. In the case of mobile device 10, CPU 34 executes code which reduces RF power output of RF amplifier 38 to prevent exceeding SAR regulatory limit 42. In other embodiments, where capacitive sensing is used to implement buttons 14, CPU 34 executes program code associated with the pressing of a button when proximity is sensed.

Figure 5A:
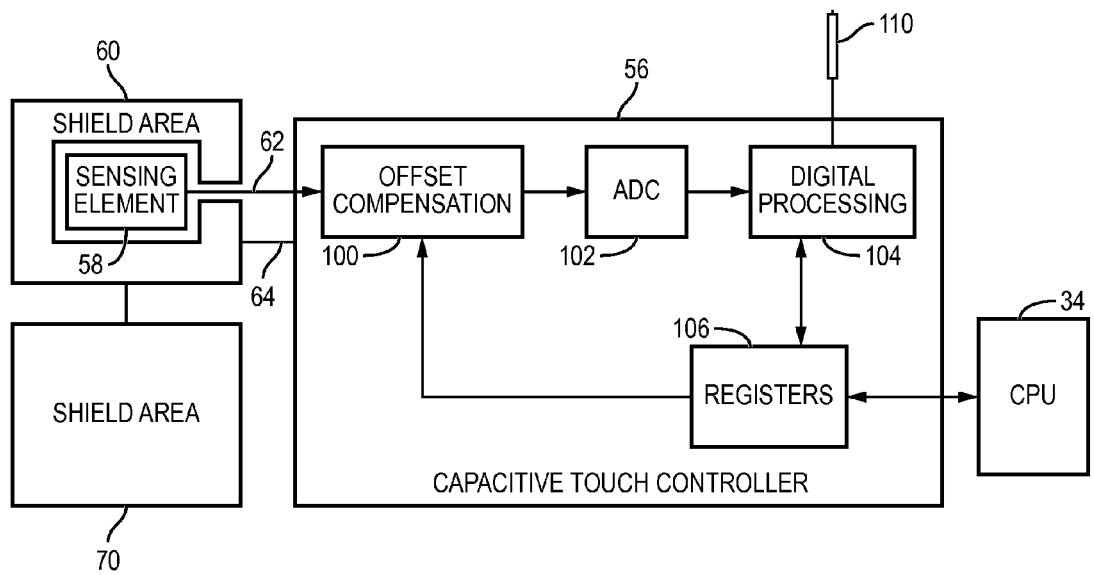
FIGS. 5a-5b illustrate the internal components of a capacitive touch controller.

FIG. 5a is a block diagram of internal components of capacitive touch controller 56. Offset compensation 100 includes a configurable bank of capacitors which are adjusted to approximately cancel the effect of Cenv so that capacitance due to the proximity of user 30, Cuser, is isolated and accurately measured. A digital value from registers 106 configures the bank of capacitors in offset compensation 100 based on a prior reading of Cenv. The configurable capacitor bank in offset compensation 100 is used to generate a voltage approximately proportional to a previously detected Cenv. Offset compensation 100 also generates a voltage approximately proportional to Csensor, i.e., the total self-capacitance of sensing element 58. Offset compensation 100 subtracts the voltage proportional to Cenv from the voltage proportional to Csensor to produce a voltage approximately proportional to Cuser. The voltage proportional to Cuser is output from offset compensation 100 to analog-to-digital converter (ADC) 102. Cuser, Csensor, and Cenv are each different values of the capacitance of the proximity sensor formed from capacitive touch controller 56 and sensing element 58.

ADC 102 receives an analog signal from offset compensation 100 that is approximately proportional to Cuser, i.e., the portion of the self-capacitance of sensing element 58 attributable to user 30. ADC 102 converts the analog input from offset compensation 100 to a digital value approximately proportional to Cuser, and outputs the digital value to digital processing unit 104.

Digital processing unit 104 receives a digital value approximately proportional to Cuser from ADC 102 and writes the value to a hardware register in registers 106. CPU 34 is interrupted, if the interrupt is not masked, to alert the CPU that a new proximity measurement has completed. The digital Cuser value written to a register in registers 106 is available to CPU 34 by reading the register. A different digital value, stored in a hardware register of registers 106 and configured by CPU 34, indicates a threshold Cuser must reach to report proximity. If the digital Cuser value from ADC 102 exceeds the threshold value from registers 106, digital processing unit 104 causes a proximity status bit in registers 106 to become a logic '1', and CPU 34 is interrupted for handling of the proximity event.

Reference temperature sensor 110 is connected to digital processing unit 104 for detecting a temperature of mobile device 10. Temperature sensor 110 is a capacitive sensing element, similar to sensing element 58, which is configured to have reduced sensitivity to the proximity of user 30. Capacitive touch controller 56 includes an offset compensation and ADC to convert self-capacitance of temperature sensor 110 to a digital value for use by digital processing unit 104. In other embodiments, offset compensation 100 and ADC 102 are used for sensing self-capacitance of sensing element 58 and temperature sensor 110. The readings of self-capacitance are time multiplexed by alternating between a reading of sensing element 58 and temperature sensor 110.

Using a capacitive element as temperature sensor 110 improves the linearity between a reading of temperature sensor 110 and the self-capacitance of sensing element 58. Using a capacitive element as temperature sensor 110 also enhances functionality by being sensitive to changes of other environmental factors, in addition to temperature, which affect self-capacitance of sensing element 58. Capacitive touch controller 56 senses environmental changes via the self-capacitance of temperature sensor 110, and calculates how the environmental changes affect the self-capacitance of sensing element 58 via a linear relationship between the temperature sensor and the sensing element. Digital processing unit 104 adjusts digital Cuser readings from ADC 102 based on changes in environmental capacitance measured using temperature sensor 110.

Temperature sensor 110 is any conductive element connected to capacitive touch controller 56. In various embodiments, temperature sensor 110 is a flat copper area on PCB 50, a trace on the PCB, a pin on the package of capacitive touch controller 56, or a pad on the semiconductor die of the capacitive touch controller. In other embodiments, temperature sensor 110 is a sensor reading a temperature or other specific environmental factors of mobile device 10, e.g., a thermistor having a resistance which is a function of temperature of the mobile device.

Digital processing unit 104 adjusts the digital value of Cuser received from ADC 102 based on the reading from temperature sensor 110 and a temperature coefficient value from registers 106. The self-capacitance of sensing element 58 varies with a reading of temperature sensor 110 in an approximately linear fashion. A manufacturer of mobile device 10 determines the relationship between the self-capacitance of sensing element 58 and the self-capacitance or other reading of temperature sensor 110. The manufacturer stores a coefficient defining the relationship between the temperature readings and self-capacitance in registers 106 prior to delivery of mobile device 10 to user 30.

Without adjusting for temperature and other environmental factors, capacitive touch controller 56 detects proximity of user 30 at a distance which is different than distance d, resulting in either non-compliance with SAR regulations or unnecessarily degraded connectivity. Digital processing unit 104 accurately adjusts the digital value of Cuser from ADC 102 to account for drift due to temperature changes. Adjusting for capacitance drift due to temperature change provides improved accuracy for the reading of self-capacitance.

Figure 5B:
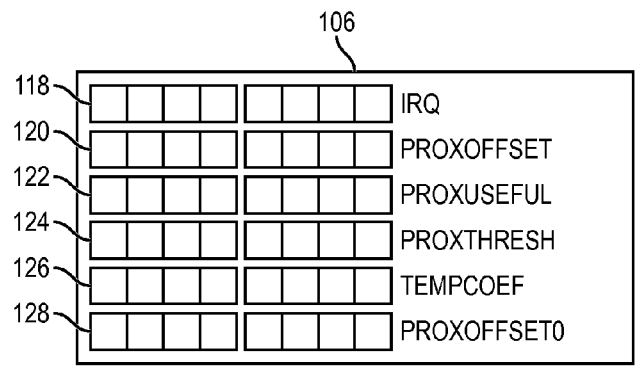

FIG. 5b illustrates hardware registers 106 in detail. Registers 106 include interrupt request (IRQ) register 118, proximity compensation offset (PROXOFFSET) register 120, useful proximity reading (PROXUSEFUL) register 122, proximity detection threshold (PROXTHRESH) register 124, temperature coefficient (TEMPCOEF) register 126, and proximity compensation offset at manufacture (PROXOFFSET0) register 128. Other registers are used in other embodiments.

IRQ register 118 includes IRQ source bits, IRQ mask bits, and status bits. IRQ source bits indicate the source of a hardware interrupt, and mask bits allow CPU 34 to "mask out" specific interrupt sources so that a hardware interrupt is not triggered for a specific interrupt source. A source bit is set by capacitive touch controller 56 when an event occurs which CPU 34 could potentially be programmed to handle. The source bit is cleared when read by CPU 34. Mask bits are set or cleared by CPU 34 to control whether an associated source bit will actually interrupt CPU 34 via a hardware interrupt signal.

Status bits indicate the status of elements in capacitive touch controller 56 without causing an interrupt of CPU 34, and are not cleared with the IRQ source bits. In some embodiments, IRQ source bits are mapped to a first memory address of capacitive touch controller 56, IRQ mask bits are mapped to a second memory address, and the status bits are mapped to a third memory address. The IRQ source bits of IRQ register 118 are set by the internal circuitry of capacitive touch controller 56 to trigger an interrupt of CPU 34. Capacitive touch controller 56 triggers an interrupt of CPU 34 by asserting an interrupt signal on an IRQ line of traces 66. When CPU 34 is interrupted by capacitive touch controller 56, the CPU reads the IRQ source bits of IRQ register 118 to determine the source of the interrupt. CPU 34 executes different programming depending on which interrupt occurs.

IRQ register 118 includes separate IRQ source bits for when proximity is newly detected, when proximity is no longer detected, when calculation of Cenv for calibration has completed, and when Cuser has been measured. When an event causes an interrupt, the source bit associated with the event which occurred becomes a logic '1'. All IRQ source bits are cleared when CPU 34 reads the IRQ source bits of IRQ register 118. Some IRQ source bits of IRQ register 118 are written to by CPU 34 and control functionality of capacitive touch controller 56. CPU 34 triggers a new Cenv calibration calculation by writing a logic '1' to the calibration complete IRQ source bit. CPU 34 is interrupted when the Cenv calibration calculation is completed, and the source bit for Cenv compensation is read as a logic '1' by the CPU.

IRQ register 118 includes a mask bit for each IRQ source bit. The mask bits of IRQ register 118 determine whether an associated source bit will actually cause the interrupt signal to CPU 34 to be asserted. If a mask bit for an IRQ source is set to a logic '1', the source bit for the interrupt source will be set to a logic '1' as normal, but the hardware interrupt signal to CPU 34 will not be asserted by capacitive touch controller 56. If CPU 34 is programmed to use the raw Cuser value stored in PROXUSEFUL register 122, the CPU does not mask the interrupt source for a new reading of Cuser. However, if CPU 34 is programmed to use the proximity status determined by capacitive touch controller 56, and not the raw Cuser value stored in PROXUSEFUL register 122, the CPU masks out the interrupt for a new proximity reading and unmasks the interrupts for proximity status changes. In one embodiment, CPU 34 masks each interrupt source of IRQ register 118 and polls the IRQ register to determine if an action needs to be taken.

PROXOFFSET register 120 contains the most recent compensation value determined for the capacitor bank in offset compensation 100. A compensation value stored in PROXOFFSET register 120 is determined using a dichotomy algorithm with the capacitor bank in offset compensation 100. A first value for PROXOFFSET register 120 is used, and a raw Cuser value is captured in digital processing unit 104. If Cuser is non-zero, PROXOFFSET register 120 is modified in the direction necessary to move Cuser toward zero. The algorithm continues to modify PROXOFFSET register 120 until Cuser is as close to zero as possible given the granularity of PROXOFFSET register 120 and the capacitor bank in offset compensation 100. If PROXOFFSET register 120 causes Cuser to equal zero when no part of user 30 is in proximity to sensing element 58, the capacitor bank in offset compensation 100 cancels Cenv so that an accurate reading of Cuser is possible when the user is in proximity. The process of determining a compensation value for PROXOFFSET register 120 calibrates capacitive touch controller 56. When capacitive touch controller 56 recalculates the compensation value necessary to counteract Cenv, CPU 34 is interrupted unless the CPU masks out the interrupt.

PROXUSEFUL register 122 contains the most recent reading of Cuser. PROXUSEFUL register 122 contains a value of the capacitance of the proximity sensor formed by capacitive touch controller 56 and sensing element 58. Digital processing unit 104 populates PROXUSEFUL register 122 each time the self-capacitance of sensing element 58 is converted to a new digital Cuser value. In one embodiment, digital processing unit 104 puts the raw Cuser value from ADC 102 in PROXUSEFUL register 122. In other embodiments, digital processing unit 104 adjusts the Cuser value before populating PROXUSEFUL register 122, e.g., by adjusting Cuser for drift of Cenv, or by filtering high frequency noise. When digital processing unit 104 puts a new Cuser value in PROXUSEFUL register 122, CPU 34 is interrupted unless the CPU masks out the interrupt. CPU 34 reads PROXUSEFUL register 122 to determine the most recent reading of the Cuser component of the self-capacitance of sensing element 58.

PROXTHRESH register 124 is used by CPU 34 to set the threshold value of Cuser in PROXUSEFUL register 122 when capacitive touch controller 56 reports proximity of user 30. A lower value of PROXTHRESH register 124 allows for higher sensitivity to proximity of user 30 and detection at a greater distance, while a higher value for the PROXTHRESH register provides better noise immunity. When digital processing unit 104 puts a new Cuser value in PROXUSEFUL register 122, capacitive touch controller 56 compares the PROXUSEFUL register value to the value in PROXTHRESH register 124. If PROXUSEFUL register 122 is greater than PROXTHRESH register 124, proximity is detected. If the previous PROXUSEFUL register 122 value was less than PROXTHRESH register 124, CPU 34 is interrupted by capacitive touch controller 56 to report a new proximity detection event, unless the CPU has masked the interrupt. If PROXUSEFUL register 122 is less than PROXTHRESH register 124, an absence of proximity is detected. If the previous PROXUSEFUL register 122 value was greater than PROXTHRESH register 124, CPU 34 is interrupted by capacitive touch controller 56, unless masked, to report that the previously detected body part of user 30 in proximity has been removed. A status bit in IRQ register 118 reports whether proximity was detected on the most recent self-capacitance reading without regard to any interrupt masking or clearing performed by CPU 34.

TEMPCOEF register 126 is a parameter, calculated specifically for mobile device 10, which indicates the degree to which the capacitance reading of capacitive touch controller 56 is affected by the temperature of the mobile device and other environmental factors. Each component of mobile device 10 which effects the self-capacitance of sensing element 58 includes an approximately linear relationship between the component's effect on capacitance and the temperature of the component. Components which effect self-capacitance of sensing element 58 include resistors, inductors, and traces on PCB 50, shielding areas 60 and 70, and ICs including CPU 34 and capacitive touch controller 56.

When mobile device 10 is manufactured, a manufacturer of the mobile device determines the cumulative effect of all components in the mobile device on the self-capacitance of sensing element 58 as temperature fluctuates. The manufacturer uses capacitive touch controller 56 to determine self-capacitance of sensing element 58 with mobile device 10 at two or more different temperatures and without user 30 in proximity of the mobile device. A linear relationship between a reading of temperature sensor 110 and self-capacitance of sensing element 58 is determined, and a coefficient defining the relationship is stored by the manufacturer in TEMPCOEF register 126. In one embodiment, TEMPCOEF register 126 is implemented as a one-time programmable read-only memory so that the value of the TEMPCOEF register is not subsequently changed by CPU 34 or capacitive touch controller 56. During subsequent readings of Cuser, digital processing unit 104 uses the value in TEMPCOEF register 126 to adjust Cuser for drift due to temperature change prior to storing Cuser in PROXUSEFUL register 122.

PROXOFFSET0 register 128 contains a reference compensation value determined by a manufacturer of mobile device 10 when the mobile device is manufactured. A manufacturer of mobile device 10 performs a self-capacitance calibration with the mobile device in a known state with no user 30 in proximity to sensing element 58. The reading of Cenv with no user 30 in proximity is stored as a known valid compensation value in PROXOFFSET0 register 128, which is implemented as a one-time programmable read-only memory in one embodiment. PROXOFFSET0 register 128 is used during subsequent calibration of capacitive touch controller 56 as a reference compensation value to determine whether a compensation value stored in PROXOFFSET register 120 is valid, or if a portion of user 30 in proximity to sensing element 58 disrupted calibration.

After a later calibration, capacitive touch controller 56 places the detected Cenv compensation value in PROXOFFSET register 120. PROXOFFSET register 120 has a known range of valid compensation values determined based on the value of PROXOFFSET0 register 128 and the normal fluctuations of Cenv due to temperature, humidity, and other environmental factors. When calibration occurs, and PROXOFFSET register 120 contains a compensation value outside of the normal operating range for the PROXOFFSET register relative to the value in PROXOFFSET0 register 128, capacitive touch controller 56 determines that proximity of user 30 affected the self-capacitance reading. The value in PROXOFFSET register 120 is discarded and calibration is automatically performed again after a predetermined period of time. In some embodiments, a second calibration is not automatically performed, but instead CPU 34 is interrupted for determination of how to proceed.

In some embodiments, the manufacturer calculates PROXOFFSET with no user in proximity to sensing element 58, and again with a body part, or another conductive object approximating the capacitive effect of a body part, in proximity to the sensing element. PROXOFFSET0 register 128 is set to a value between the two PROXOFFSET readings as a reference threshold for proximity. Capacitive touch controller 56 subsequently uses PROXOFFSET0 register 128 as a threshold for determining proximity when PROXOFFSET register 120 is not initialized, e.g., after a reset and prior to calibration. If the total self-capacitance of sensing element 58, Csensor, is above the level set by PROXOFFSET0 register 128, capacitive touch controller 56 reports proximity to CPU 34. Detecting proximity with PROXOFFSET0 register 128 when PROXOFFSET register 120 is not initialized allows proximity detection to occur soon after capacitive touch controller 56 boots, reducing the likelihood of a high power RF mode being enabled with user 30 in proximity.

In one embodiment, PROXOFFSET0 register 128 is used to determine proximity after PROXOFFSET register 120 is initialized. Capacitive touch controller 56 reports proximity to CPU 34 if a determination of proximity is made based on PROXOFFSET register 120 or PROXOFFSET0 register 128.

Figure 6A:
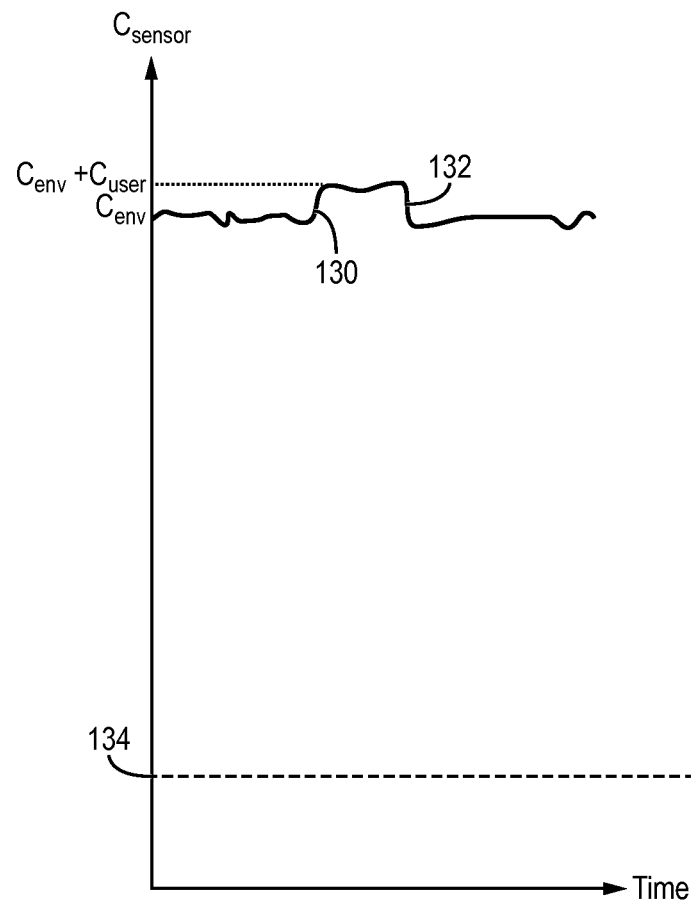
FIGS. 6a-6b illustrate capacitance detection with and without calibration.

FIG. 6a illustrates the self-capacitance of sensing element 58 without compensation to eliminate the effect of environmental capacitance, Cenv. The graph of FIG. 6a includes time on the horizontal axis, and the self-capacitance of sensing element 58, Csensor, on the vertical axis. FIG. 6a shows a proximity event occurring over time, with a new proximity reading at point 130. The proximity event ends at point 132. Without compensating for self-capacitance of sensing element 58 to eliminate the effect of environmental capacitance, the contribution of Cuser is a small percentage of the total self-capacitance being detected, and is challenging to differentiate. In one embodiment, the environmental capacitance, Cenv, of sensing element 58 is approximately 10 picofarads (pF) while the capacitance change to be detected for proximity, Cuser, is approximately 0.01 pF.

In addition, calibrating offset compensation 100 to disregard environmental self-capacitance of sensing element 58 allows ADC 102 to give a higher resolution reading in the range of capacitance between Cenv and Cenv+Cuser. Capacitance level 134 indicates self-capacitance at the maximum digital output of ADC 102, which is lower than the environmental capacitance. With ADC 102 configured to output values which extend beyond Cenv+Cuser to sense capacitance without compensation, the ADC includes a lower resolution digital output in the active range of capacitance above Cenv.

Figure 6B:
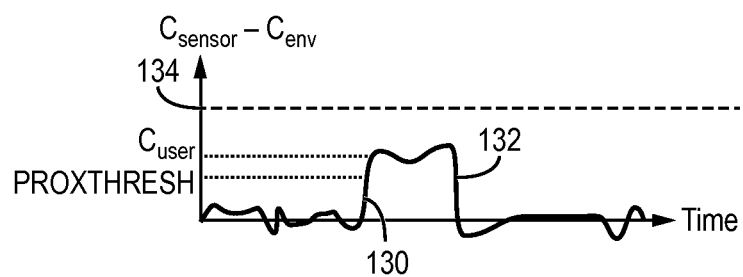

FIG. 6b is a similar plot as shown in FIG. 6a, with the horizontal axis reflecting time. The vertical axis of FIG. 6b shows Csensor with Cenv cancelled out by the capacitor bank in offset compensation 100, as configured by PROXOFFSET register 120. When user 30 is not in proximity, i.e., outside of the area between points 130 and 132, the capacitance reading output from ADC 102 to digital processing unit 104 floats near 0. When user 30 moves a body part within proximity of sensing element 58 at point 130, the capacitance reading output by ADC 102 reflects the value of self-capacitance attributable to the user and does not include the capacitance attributable to environmental factors. ADC 102 is configured so that Cuser is a significant portion of the total range of the digital output of the ADC. ADC 102 gives a high resolution reading of the active range of capacitance between zero and Cuser. Between points 130 and 132, Cuser, and thus PROXUSEFUL register 122, is above the value in PROXTHRESH register 124. Capacitive touch controller 56 reports to CPU 34 that user 30 is in proximity.

Figure 7A:
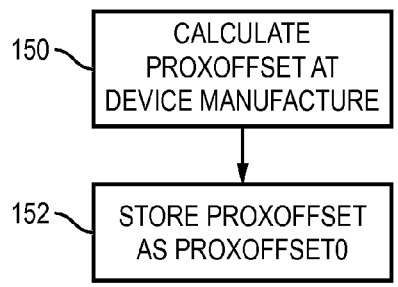
FIGS. 7a-7b illustrate the process of calibrating a capacitive touch controller to compensate for environmental capacitance.

FIG. 7a illustrates the process of a manufacturer of mobile device 10 determining the environmental self-capacitance of sensing element 58 and saving the value in PROXOFFSET0 register 128 during manufacturing of the mobile device. During step 150, a manufacturer of mobile device 10 calculates Cenv, i.e., the contribution of the parts of the mobile device to the self-capacitance of sensing element 58. The manufacturer ensures that during calculation of Cenv, the area adjacent to sensing element 58 is substantially free from any human body or other conductive material external to mobile device 10 having an effect on capacitance. By limiting the external capacitive influence, the initial calculation of Cenv during manufacture is known to be an accurate reading of the self-capacitance on sensing-element 58 due to the conductive components of mobile device 10.

Step 150 involves the manufacturer of mobile device 10 running the normal calibration process of capacitive touch controller 56 to populate a value in PROXOFFSET register 120. A dichotomy algorithm determines the value of PROXOFFSET register 120 which configures the capacitor bank in offset compensation 100 to give an ADC 102 output as close to 0 as possible. In one embodiment, calibration results in a digital value proportional to Cenv stored in PROXOFFSET register 120. In other embodiments, each bit of PROXOFFSET register 120 controls a different switched capacitor making up the capacitor bank in offset compensation 100.

Each individual mobile device 10 is booted up in isolation from capacitive influence other than Cenv after the mobile device is manufactured. CPU 34 recognizes that PROXOFFSET0 register 128 is not initialized at boot time, and runs a routine to detect Cenv and populate PROXOFFSET register 120. In other embodiments, a manufacturer detects Cenv only once for a given product line, and uses the same Cenv value to set PROXOFFSET0 register 128 for each mobile device 10 manufactured to the same specification.

In step 152, the value of PROXOFFSET register 120, which is known by a manufacturer of mobile device 10 to include Cenv without a significant external contribution, is stored in PROXOFFSET0 register 128. In embodiments where each individual mobile device 10 is booted to calculate Cenv after manufacturing, the programming of CPU 34 realizes PROXOFFSET0 register 128 is not initialized, causes a calculation of PROXOFFSET, and then causes the most recent value in PROXOFFSET register 120 to be stored in the PROXOFFSET0 register. In embodiments where a manufacturer calculates a single Cenv value to be programmed into PROXOFFSET0 register 128 of each mobile device 10, the PROXOFFSET0 register is programmed in a manufacturing step prior to completion of mobile device 10. Capacitive touch controller 56 is fabricated with PROXOFFSET0 register 128 hard-coded to the desired value. In other embodiments, PROXOFFSET0 register 128 is programmed after fabrication of capacitive touch controller 56 but prior to being disposed on PCB 50 using temporary electrical connections to the capacitive touch controller IC.

In some embodiments, a second determination of PROXOFFSET register 120 is performed with a body part, or a conductive object approximating the effect of a body part on self-capacitance, within proximity of sensing element 58. A value between the values of PROXOFFSET register 120 with and without a body part in proximity is stored in PROXOFFSET0 register 128. The value stored in PROXOFFSET0 register 128 is greater than necessary to merely cancel Cenv, and is used as a threshold for determining proximity prior to PROXOFFSET register 120 being initialized via the process shown in FIG. 7b.

PROXOFFSET0 register 128 is implemented as a read-only memory using fuses in capacitive touch controller 56 to allow only one write to the PROXOFFSET0 register. In other embodiments, an erasable programmable read-only memory (EPROM) or flash memory is used to implement PROXOFFSET0 register 128 so that the value in the PROXOFFSET0 register is changed by an update from the manufacturer when necessary. In yet other embodiments, PROXOFFSET0 register 128 is implemented as volatile memory, and CPU 34 is programmed to restore a known good value for the PROXOFFSET0 register each time mobile device 10 is booted.

Figure 7B:
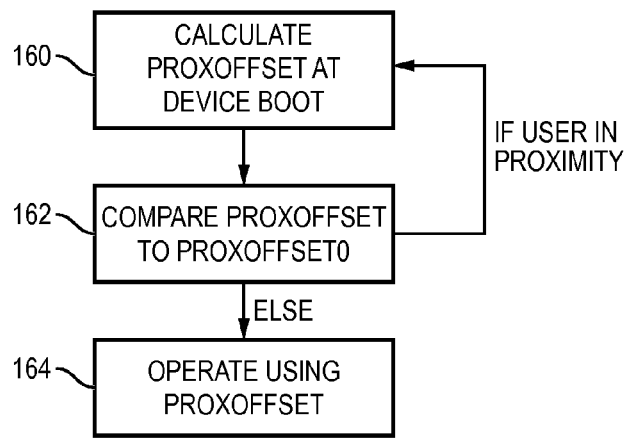

FIG. 7b illustrates a method of calibrating capacitive touch controller 56 by detecting Cenv, and comparing Cenv to the value previously stored in PROXOFFSET0 register 128. Calibration is triggered automatically by a reset of capacitive touch controller 56, e.g., when mobile device 10 is booted. Calibration is also triggered at any time by a request from CPU 34. CPU 34 also configures capacitive touch controller 56 to automatically recalibrate periodically.

Prior to determination of a value for PROXOFFSET register 120 via the calibration shown in FIG. 7b, proximity is detected based on PROXOFFSET0 register 128. PROXOFFSET0 register 128 contains a value greater than needed to merely cancel environmental capacitance. Proximity is reported by capacitive touch controller 56 when Csensor is greater than PROXOFFSET0 register 128, and proximity is not reported when capacitive touch controller 56 is less than the PROXOFFSET0 register. In other embodiments, capacitive touch controller 56 contains a reference Cuser value in registers 106 in addition to the reference PROXOFFSET value in PROXOFFSET0 register 128. Proximity is reported to CPU 34 when Csensor is within a predetermined range of PROXOFFSET0 register 128 with the reference Cuser value added.

At step 160, capacitive touch controller 56 calculates the value of PROXOFFSET register 120 required to cancel the environmental self-capacitance of sensing element 58, i.e., Cenv. The value in PROXOFFSET register 120 is more accurate than the value in PROXOFFSET0 register 128 due to being calculated contemporaneously with proximity detection. The value in PROXOFFSET register 120 is calculated under environmental conditions, e.g., temperature and humidity, in which mobile device 10 is likely to be used. PROXOFFSET0 is a valid PROXOFFSET value provided for reference, but does not include consideration of the actual environmental variables of each use of mobile device 10.

On the other hand, PROXOFFSET0 register 128 does contain a known good Cenv reading, calculated with a controlled value of Cuser. The proximity of user 30 during calculation of the value for PROXOFFSET register 120 is a variable which is not predictable by a manufacturer of mobile device 10. In some usage scenarios, user 30 boots mobile device 10 while a body part of the user is in proximity, or a calibration of capacitive touch controller 56 is triggered for another reason while user 30 is in proximity. Without comparison to PROXOFFSET0 register 128, calibrating capacitive touch controller 56 while user 30 is in proximity causes offset compensation 100 to eliminate not only environmental capacitance, but also a portion of the self-capacitance of sensing element 58 attributable to the user. When offset compensation 100 eliminates a portion of Cuser along with Cenv, proximity is more difficult to detect.

In some embodiments, where digital processing unit 104 will adjust readings of Cuser prior to storage in PROXUSEFUL register 122, the digital processing unit stores a temperature reading from temperature sensor 110 in a memory or register of capacitive touch controller 56 as a part of calibration. During subsequent detection of Cuser, the stored temperature is used to determine the magnitude by which the temperature has changed since calibration.

PROXOFFSET register 120 is compared to PROXOFFSET0 register 128 in step 162 to determine whether user 30 was in proximity of sensing element 58 during calculation of the value for the PROXOFFSET register. PROXOFFSET0 register 128 defines a range of potential PROXOFFSET register 120 values, because mobile device 10 is likely to be used within a determinable range of environmental factors. For example, a manufacturer of mobile device 10 may certify the mobile device for use in a temperature range of between 35 degrees Fahrenheit (° F.) and 125° F. A manufacturer of mobile device 10 calculates the amount self-capacitance of sensing element 58 drifts between 35° F. and 125° F. A range of valid PROXOFFSET register 120 values relative to a value of PROXOFFSET0 register 128 is calculable by considering ranges of environmental variables mobile device 10 will be exposed to. Capacitive touch controller 56 determines that if a newly calculated PROXOFFSET register 120 value is outside of the normal range relative to PROXOFFSET0 register 128, the most recent Cenv calculation includes additional capacitance due to the proximity of user 30.

If a comparison of PROXOFFSET register 120 to PROXOFFSET0 register 128 reveals that calibration was performed with user 30 in proximity to sensing element 58, the value of the PROXOFFSET register is discarded and the process returns to step 160. Capacitive touch controller 56 continues to calculate proximity using PROXOFFSET0 register 128 until a good value is stored in PROXOFFSET register 120. Capacitive touch controller 56 calculates a new value for PROXOFFSET register 120 immediately, interrupts CPU 34 and waits for instruction from the CPU, or does nothing and waits until recalibration occurs in due course.

If PROXOFFSET register 120 is within an allowable range relative to PROXOFFSET0 register 128, the process advances to step 164 to detect proximity using the PROXOFFSET register to define the magnitude of Cenv cancelled by offset compensation 100. The value in PROXOFFSET register 120 is used for proximity detection until recalibration of capacitive touch controller 56 is triggered, which returns the process in FIG. 7b to step 160.

In some embodiments, PROXOFFSET0 register 128 is used for proximity detection in addition to PROXOFFSET register 120 during step 164. Proximity is determined relative to both PROXOFFSET0 register 128 and PROXOFFSET register 120, and proximity is reported to CPU 34 if either calculation results in a finding of proximity of user 30.

Figure 8A:
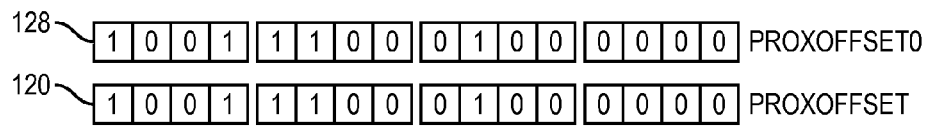
FIGS. 8a-8c illustrate hardware registers used for calibration of a capacitive touch controller.
Figure 8B:
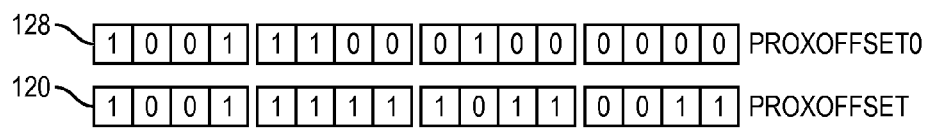
Figure 8C:
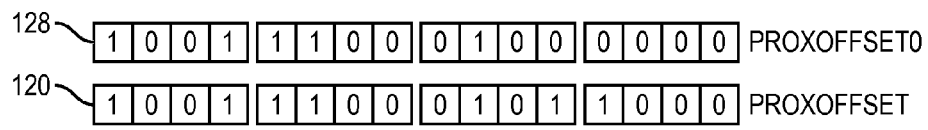

FIGS. 8a-8c illustrate PROXOFFSET register 120 and PROXOFFSET0 register 128 during stages of the processes illustrated in FIGS. 7a-7b. FIG. 8a illustrates the registers during step 152 of FIG. 7a. A calibration process occurred during step 150 which determined that a PROXOFFSET register 120 value of 1001 1100 0100 0000 in binary (9C40 in hexadecimal) properly configured the capacitor bank in offset compensation 100 to counteract Cenv as accurately as possible. A value of PROXOFFSET register 120 is determined using a dichotomy algorithm, also known as a bisection or binary search algorithm. In one embodiment, each bit of PROXOFFSET register 120 determines the state of a switched capacitor in offset compensation 100. Capacitive touch controller 56 copies the value determined for PROXOFFSET register 120, hexadecimal (hex) value 9C40, into PROXOFFSET0 register 128 for determining the validity of subsequent calculations of the PROXOFFSET register.

In other embodiments, PROXOFFSET is calculated with no user in proximity, and a second time with a user in proximity, and PROXOFFSET0 register 128 is set to a value between the two measurements. The increased PROXOFFSET0 register 128 acts as a threshold to detect proximity when PROXOFFSET register 120 does not contain a valid compensation value.

FIG. 8b illustrates PROXOFFSET register 120 and PROXOFFSET0 register 128 during step 162 of FIG. 7b. PROXOFFSET0 register 128 retains the hex value 9C40 due to being read-only. Capacitive touch controller 56 has recalibrated offset compensation 100 and determined a binary value of 1001 1111 1011 0011 (9FB3 in hex) for PROXOFFSET register 120. A hex value of 9FB3 indicates that the self-capacitance of sensing element 58 is off by approximately 2.2% compared to the reference Cenv calibration stored in PROXOFFSET0 register 128. Capacitive touch controller 56 determines that a hex value of 9FB3 is outside of the range which PROXOFFSET register 120 would reach due to normal variations of environmental factors. Capacitive touch controller 56 discards the contents of PROXOFFSET register 120 and returns to step 160. Unless the interrupt is masked, CPU 34 is interrupted to notify the CPU that a calibration process failed to generate a valid value for PROXOFFSET register 120. In other embodiments, where PROXOFFSET0 register 128 includes an increased value for use as an alternative proximity threshold, digital processing unit 104 adjusts for the known discrepancy to determine validity of the value in PROXOFFSET register 120.

FIG. 8c illustrates PROXOFFSET register 120 and PROXOFFSET0 register 128 during step 162 of FIG. 7b. PROXOFFSET0 register 128 retains the hex value 9C40. Capacitive touch controller 56 has recalibrated offset compensation 100 and determined a binary value of 1001 1100 0101 1000 (9C58 in hex) for PROXOFFSET register 120. A hex value of 9C58 indicates that the self-capacitance of sensing element 58 has drifted by 0.06% compared to Cenv during calculation of the value of PROXOFFSET0 register 128. Capacitive touch controller 56 determines that a hex value of 9C58 is within the range which PROXOFFSET register 120 reaches due to normal variations of environmental factors such as temperature and humidity. Capacitive touch controller 56 advances to step 164 of FIG. 7b, in which the hex value 9C58 in PROXOFFSET register 120 configures the capacitor bank in offset compensation 100 to cancel Cenv. Unless the interrupt is masked, CPU 34 is interrupted to notify the CPU that a calibration process completed successfully.

A manufacturer of mobile device 10 determines a valid PROXOFFSET value during development, or in the production chain, of the mobile device, which is stored in PROXOFFSET0 register 128 of capacitive touch controller 56. When subsequently performing calibration of offset compensation 100, a newly calculated PROXOFFSET value is checked against the manufacturer's PROXOFFSET value in PROXOFFSET0 register 128 to determine whether the new value includes additional capacitance due to user 30 being in proximity of sensing element 58. If user 30 is in proximity of sensing element 58 and calibration is performed, the contribution of Cuser will be absorbed as part of the environmental capacitance, Cenv, and proximity will not be reported even if the user is physically present. Comparing the new PROXOFFSET value against the reference PROXOFFSET value calculated by the manufacturer allows spurious PROXOFFSET readings to be discarded instead of used to produce incorrect proximity readings. PROXOFFSET is recalculated until a valid value of PROXOFFSET register 120 is determined. PROXOFFSET0 register 128 is used to determine proximity until a valid compensation value is stored in PROXOFFSET register 120.

Figure 9:
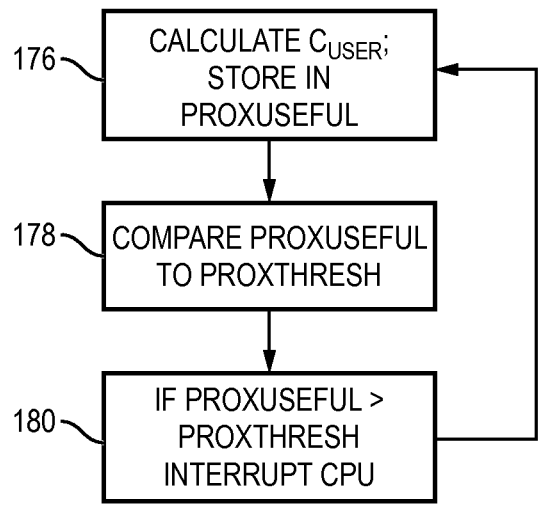
FIG. 9 illustrates the process of determining proximity of a user to a mobile device.

FIG. 9 illustrates a method of detecting proximity of user 30 to sensing element 58. In step 176, capacitive touch controller 56 determines Cuser. Offset compensation 100 converts the self-capacitance of sensing element 58 to a proportional voltage potential and cancels a portion approximately equivalent to the environmental capacitance, Cenv, using a bank of capacitors configured by PROXOFFSET register 120. ADC 102 converts the voltage from offset compensation 100 to a digital value which is transmitted to digital processing unit 104. Digital processing unit 104 stores the digital value of Cuser in PROXUSEFUL register 122 after performing any desired digital processing of the value.

In step 178, PROXUSEFUL register 122 is compared to PROXTHRESH register 124. If the value of PROXUSEFUL register 122 is greater than the value of PROXTHRESH register 124, capacitive touch controller 56 concludes that user 30 is in proximity of sensing element 58. If the value of PROXUSEFUL register 122 is less than the value of PROXTHRESH register 124, capacitive touch controller 56 concludes that user 30 is not in proximity of sensing element 58. A status bit in IRQ register 118 is set if proximity is detected, and cleared if proximity is not detected, whether an interrupt of CPU 34 is to be triggered or not.

In step 180, digital processing unit 104 sets an interrupt bit in IRQ register 118 if appropriate. In the case of detecting a new proximity event, as illustrated in FIG. 9, PROXUSEFUL register 122 is initially less than PROXTHRESH register 124, and CPU 34 is interrupted to indicate a new proximity event once the PROXUSEFUL register becomes greater than the PROXTHRESH register. In the case where PROXUSEFUL register 122 is initially greater than PROXTHRESH register 124, a new value of the PROXUSEFUL register which is higher than the PROXTHRESH register does not result in an interrupt of CPU 34. When PROXUSEFUL register 122 is already greater than PROXTHRESH register 124, CPU 34 is interrupted when the value of PROXUSEFUL register falls below the value of the PROXTHRESH register to notify the CPU that user 30 is no longer in proximity of sensing element 58. In some embodiments, proximity is calculated independently based on PROXOFFSET0 register 128, in addition to the calculation based on PROXOFFSET register 120. Proximity is reported to CPU 34 if proximity is detected relative to PROXOFFSET0 register 128 or PROXOFFSET register 120.

Figure 10A:
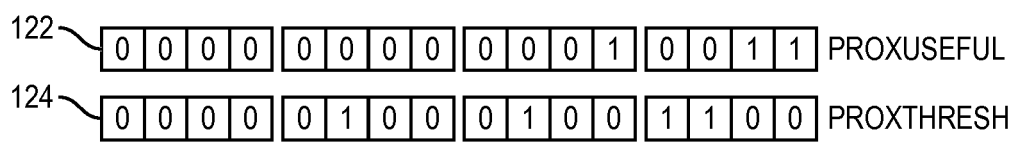
FIGS. 10a-10b illustrate hardware registers used for determination of proximity.

FIG. 10a illustrates PROXUSEFUL register 122 and PROXTHRESH register 124 during step 178 of FIG. 9 when no proximity of user 30 to sensing element 58 is detected. A digital Cuser value of 0000 0000 0001 0011 in binary (0013 in hex) is transmitted from ADC 102 to digital processing unit 104 and stored in PROXUSEFUL register 122. CPU 34 has previously written the value of 0000 0100 0100 1100 (044C in hex) into PROXTHRESH register 124. The value of PROXUSEFUL register 122 is less than the value of PROXTHRESH register 124, but non-zero, indicating drift of Cenv or that something with a smaller impact on capacitance than a body part of user 30 is in proximity of sensing element 58. PROXUSEFUL register 122 is less than PROXTHRESH register 124, and capacitive touch controller 56 concludes user 30 is not in proximity to sensing element 58. In step 180, CPU 34 is interrupted if the previous value of PROXUSEFUL register 122 was greater than PROXTHRESH register 124, and the interrupt is not masked, to indicate that a previous proximity event has ended.

Figure 10B:
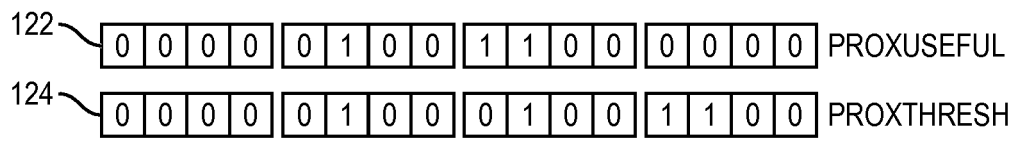

FIG. 10b illustrates PROXUSEFUL register 122 and PROXTHRESH register 124 during step 178 of FIG. 9 when user 30 is in proximity of sensing element 58. A digital Cuser value of 0000 0100 1100 0000 in binary (04C0 in hex) is transmitted from ADC 102 to digital processing unit 104 and stored in PROXUSEFUL register 122. CPU 34 has previously written the value of 0000 0100 0100 1100 (044C in hex) into PROXTHRESH register 124. PROXUSEFUL register 122 contains a value greater than the value of PROXTHRESH register 124, indicating that user 30 is in proximity of sensing element 58. In step 180, CPU 34 is interrupted if the previous value of PROXUSEFUL register 122 was less than PROXTHRESH register 124, and the interrupt is not masked, to indicate a new proximity event has begun.

Figure 11:
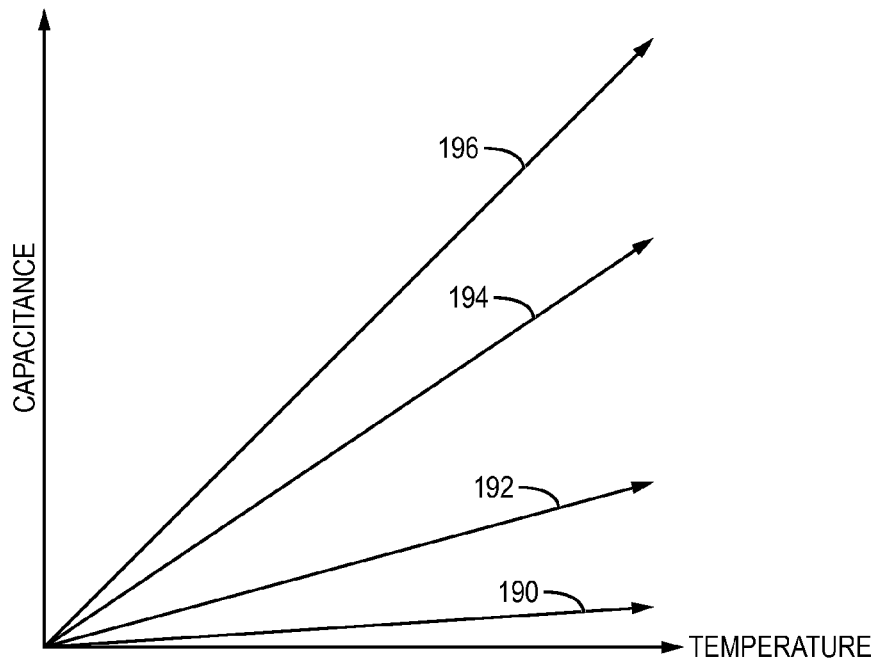
FIG. 11 illustrates the effect of temperature on detected capacitance.

FIG. 11 illustrates the cumulative effects of temperature on various elements exhibiting capacitance with sensing element 58. Each component which exhibits a capacitive effect with sensing element 58 has a temperature susceptibility component. The temperature susceptibility component of each element contributing to the self-capacitance of sensing element 58 is summed to calculate the total effect of a temperature change on the self-capacitance of sensing element 58.

Line 190 illustrates the effect of temperature on the capacitance between sensing element 58 and the integrated circuit of capacitive touch controller 56. Line 192 illustrates the effect of temperature on capacitance illustrated by line 190 with the addition of the effect of a resistor located on PCB 50 near sensing element 58. Line 194 illustrates the effect of temperature on capacitance illustrated by line 192 with the addition of the effect of a trace and an inductor near sensing element 58. Line 196 illustrates the total cumulative effect of temperature change on self-capacitance of sensing element 58, including the effect on capacitance due to antenna 32 and a connector on PCB 50 for connecting an external antenna, in addition to the effects illustrated by line 194.

FIG. 11 shows that the effect of a temperature change on the self-capacitance of sensing element 58 is cumulative. The change in capacitance over a temperature range due to each individual component adds up. After a temperature change of mobile device 10, capacitive touch controller 56 generates incorrect proximity reporting. Significant temperature changes result in incorrect proximity readings, or prevent proximity from being detected.

Figure 12A:
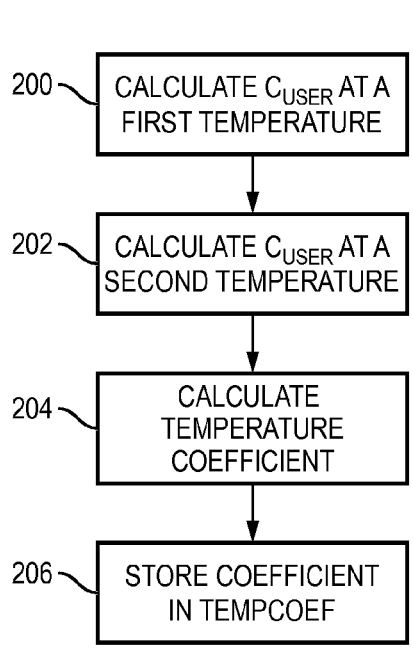
FIGS. 12a-12b illustrate the process of calculating the capacitance of a sensing element while compensating for temperature.
Figure 12B:
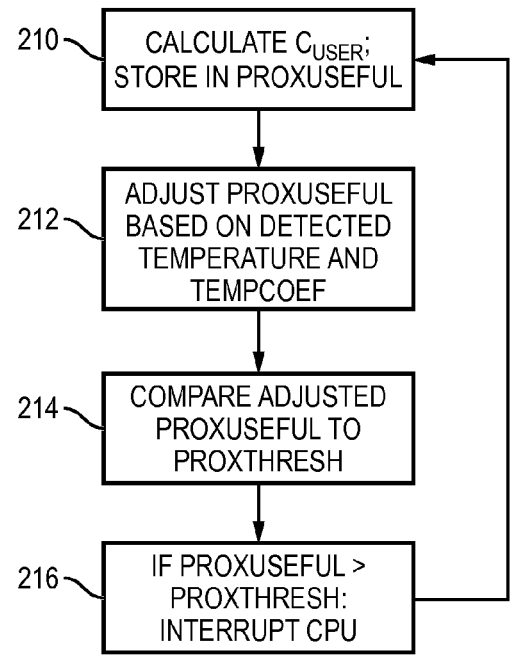

FIGS. 12*a*-12*b* illustrate a method of modifying PROXUSEFUL register 122 to compensate for temperature changes using temperature sensor 110 and the value of TEMPCOEF register 126. FIG. 12*a* illustrates steps performed by a manufacturer of mobile device 10 to generate and store a coefficient defining the relationship between self-capacitance of sensing element 58 and the temperature of mobile device 10 in TEMPCOEF register 126.

First, in step 200, a manufacturer calculates the self-capacitance of sensing element 58 at a first temperature. The manufacturer runs capacitive sensing with capacitive touch controller 56 as normal, and uses CPU 34 to read a value of Cuser from PROXUSEFUL register 122.

Next, in step 202, the manufacturer calculates the self-capacitance of sensing element 58 at a second temperature. The manufacturer calculates self-capacitance at the second temperature without significantly changing other variables which effect capacitance, so that the effect of temperature on capacitance is accurately reflected. The manufacturer captures several values of Cuser at each temperature to improve accuracy.

With a value of the self-capacitance of sensing element 58 calculated for at least two different temperatures, the manufacturer calculates a coefficient defining a linear relationship between a reading of temperature sensor 110 and the self-capacitance of sensing element 58 in step 204. For example, the manufacturer makes the first capacitance reading at 50° F. and capacitive touch controller 56 reports a capacitance of 0 pF due to calibration of the capacitive touch controller occurring under similar conditions. Without changing other variables affecting capacitance, the manufacturer raises the temperature of mobile device 10 to 100° F., and capacitive touch controller 56 reports a capacitance of 0.05 pF. In the above example, a temperature change of 50° F. results in a change in the self-capacitance of sensing element 58 of 0.05 pF, or 0.001 pF/° F. In one embodiment, a coefficient defining a linear relationship between the self-capacitance of temperature sensor 110 and the self-capacitance of sensing element 58, as temperature varies, is used as the value of TEMPCOEF register 126.

In step 206, the manufacturer stores the discovered coefficient in TEMPCOEF register 126. In the above example, the manufacturer stores a value in TEMPCOEF register 126 indicating a capacitance change of 0.001 pF per 1° F. of temperature change. In one embodiment, TEMPCOEF register 126 is implemented as a one-time programmable ROM register using fuses to prevent overwriting of the register. In a second embodiment, TEMPCOEF register 126 is implemented as flash memory in capacitive touch controller 56 which allows an update from the manufacturer to modify TEMPCOEF register 126. In other embodiments, TEMPCOEF register 126 is implemented as volatile memory, and CPU 34 writes the coefficient determined in step 204 to the TEMPCOEF register each time capacitive touch controller 56 boots.

FIG. 12*b* illustrates a process of digital processing unit 104 adjusting a self-capacitance reading to compensate for temperature change using TEMPCOEF register 126 and temperature sensor 110. In step 210, Cuser is calculated by offset compensation 100 cancelling environmental capacitance and converting the remaining capacitance to a voltage level. ADC 102 converts the voltage level to a digital value. Digital processing unit 104 stores the value in PROXUSEFUL register 122. In some embodiments, Cuser is not stored in PROXUSEFUL register 122 before adjusting for temperature, but only after being adjusted for temperature.

In step 212, digital processing unit 104 adjusts the value of PROXUSEFUL register 122 based on the temperature change since capacitive touch controller 56 was last calibrated. During step 160 in FIG. 7*b*, digital processing unit 104 reads the self-capacitance of temperature sensor 110 and stores a value of the self-capacitance in memory or a register of capacitive touch controller 56. In other embodiments, a reading of a value of the temperature of mobile device 10 from temperature sensor 110 is stored. Digital processing unit 104 reads the self-capacitance of temperature sensor 110, or the temperature of mobile device 10, again during step 214 and calculates the change since capacitive touch controller 56 was last calibrated. The change in the reading of temperature sensor 110 since last calibration is multiplied by the value of TEMPCOEF register 126 to determine the total required adjustment to the value in PROXUSEFUL register 122. The product of TEMPCOEF register 126 and the change in temperature sensor 110 is subtracted from PROXUSEFUL register 122 to adjust for the changes in temperature and other environmental factors. In the case where the temperature of mobile device 10 is lower than during calibration, the product with TEMPCOEF register 126 is negative and subtracting from PROXUSEFUL register 122 results in an increased value for Cuser in the PROXUSEFUL register.

In one example, mobile device 10 is at a temperature of 80° F. during calibration of capacitive touch controller 56, while at a later reading of Cuser the mobile device is at 84° F. With a temperature change of +4° F. and a TEMPCOEF register 126 value of 0.001 pF/° F., the product to be subtracted from PROXUSEFUL register 122 is 4° F.*0.001 pF/° F., or 0.004 pF. The equivalent of 0.004 pF is subtracted from the value of PROXUSEFUL register 122 so the PROXUSEFUL register approximately equals the value which would have been read at 80° F. In one embodiment, the least significant bit of PROXUSEFUL register 122 represents 1/4000 pF, so the actual binary value to be subtracted in the above example is 0000 0000 0001 0000, or 0010 in hex.

In another example, capacitive touch controller 56 is calibrated at 81° F., and a reading of the self-capacitance of sensing element 58 is performed at 75° F. The product to be subtracted from PROXUSEFUL register 122 is equal to −5° F.*0.001 pF/° F., or −0.005 pF. To adjust PROXUSEFUL register 122, digital processing unit adds the binary value 0000 0000 0001 0100, or 0014 hex, to the PROXUSEFUL register. In some embodiments, digital processing unit 104 adjusts the value of Cuser prior to storage in PROXUSEFUL register 122. In embodiments where temperature is sensed by reading self-capacitance of temperature sensor 110, a change in the self-capacitance of temperature sensor 110 is determined. The required adjustment to the Cuser reading of sensing element 58 is determined by multiplying the change in capacitance of temperature sensor 110 and the value of TEMPCOEF register 126.

In steps 214-216, capacitive touch controller 56 continues with normal operation, similar to steps 178-180 in FIG. 9, but with PROXUSEFUL register 122 adjusted for drift due to temperature and other environmental factors. In step 214, digital processing unit 104 compares PROXUSEFUL register 122, which is adjusted for temperature variation, to PROXTHRESH register 124 to determine whether a portion of user 30 is in the proximity of sensing element 58. In step 216, capacitive touch controller 56 interrupts CPU 34 if the value in PROXUSEFUL register 122 is greater than the value in PROXTHRESH register 124, due to the previous reading of the self-capacitance of sensing element 58 indicating an absence of proximity.

When measuring the self-capacitance of sensing element 58, capacitive touch controller 56 adjust readings to account for capacitance drift caused by temperature changes. Each of the elements composing the capacitance to be measured, e.g., ICs, connectors, antennas, and other components, has a temperature susceptibility component which will each add up and create incorrect proximity reporting. If the drift impact on self-capacitance of sensing element 58 is greater than the projected impact of user 30 on self-capacitance, proximity is not detected when the user is actually in proximity. Because of the linear relationship between electrical components and effect on capacitance, capacitive touch controller 56 implements digital temperature compensation using reference temperature sensor 110 to determine a temperature, then multiplying the temperature by a coefficient determined during development of mobile device 10. The product of the temperature and the coefficient is subtracted from the reading of Cuser to determine a temperature drift free value of Cuser.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of detecting proximity, comprising:
   providing a mobile device including a proximity sensor;
   coupling a capacitive sensing element to the proximity sensor;
   determining a compensation value of the proximity sensor;
   comparing the compensation value to a reference compensation value to determine validity of the compensation value; and
   adjusting a voltage potential of the proximity sensor proportionally to the compensation value.

2. The method of claim 1, wherein adjusting the voltage potential of the proximity sensor includes adjusting a capacitance of the proximity sensor based on the compensation value.

3. The method of claim 1, further including:
   coupling the voltage potential to an analog-to-digital converter to generate a digital representation of the voltage potential; and
   adjusting the digital representation based on a temperature of the mobile device.

4. The method of claim 1, further including comparing the adjusted voltage potential to a threshold to determine proximity of an object to the mobile device.

5. The method of claim 1, further including calculating a coefficient defining a relationship between a capacitance of the proximity sensor and a temperature of the mobile device.

6. A method of detecting proximity, comprising:
   providing a mobile device including a proximity sensor;
   determining a compensation value of the proximity sensor;
   determining validity of the compensation value by comparing the compensation value to a reference compensation value; and
   adjusting a capacitor bank of the proximity sensor based on the compensation value after determining the compensation value is valid.

7. The method of claim 6, further including determining proximity of an object to the mobile device by measuring a capacitance of the proximity sensor.

8. The method of claim 6, further including adjusting a reading of the proximity sensor based on a temperature of the mobile device.

9. The method of claim 6, further including comparing the adjusted reading to a threshold to determine proximity of an object to the mobile device.

10. The method of claim 6, further including determining a coefficient defining a relationship between a capacitance of the proximity sensor and a temperature of the mobile device.

11. The method of claim 10, further including:
    measuring the capacitance of the proximity sensor;
    measuring the temperature of the mobile device; and
    adjusting a value of the capacitance of the proximity sensor based on the coefficient and the temperature of the mobile device.

12. The method of claim 6, further including providing an analog-to-digital converter to generate a digital representation of the adjusted reading of the proximity sensor, wherein the adjusted reading of the proximity sensor is an analog voltage potential reduced based on the compensation value.

13. A method of detecting proximity, comprising:
    providing a proximity sensor;
    determining a reference compensation value of the proximity sensor;
    comparing a first proximity reading to the reference compensation value to evaluate the first proximity reading as a valid compensation value or an invalid compensation value;
    adjusting subsequent readings of the proximity sensor using the first proximity reading if the first proximity reading is a valid compensation value; and
    comparing a second proximity reading to the reference compensation value to evaluate the second proximity reading as a valid compensation value or an invalid compensation value if the first proximity reading is an invalid compensation value.

14. The method of claim 13, wherein adjusting subsequent readings of the proximity sensor includes:
    providing a bank of capacitors; and
    adjusting the bank of capacitors based on the first proximity reading.

15. The method of claim 13, further including adjusting subsequent readings of the proximity sensor based on a temperature sensor.

16. The method of claim 13, further including adjusting a radio frequency signal based on the subsequent readings of the proximity sensor.

17. The method of claim 13, further including determining a coefficient defining a relationship between a capacitance of the proximity sensor and a temperature of the proximity sensor.

18. The method of claim 17, further including adjusting subsequent readings of the proximity sensor using the coefficient and the temperature of the proximity sensor.

19. A proximity sensor, comprising:
- a reference compensation value of the proximity sensor;
- a comparator for comparing a measured compensation value to the reference compensation value;
- an offset compensation configured to reduce a voltage potential of the proximity sensor based on the measured compensation value; and
- an analog-to-digital converter including an input coupled to the voltage potential.

20. The proximity sensor of claim 19, further including a temperature sensor coupled to the proximity sensor.

21. The proximity sensor of claim 19, wherein the offset compensation further includes a bank of capacitors controlled by the measured compensation value.

22. The proximity sensor of claim 19, further including a digital processor coupled to an output of the analog-to-digital converter.

* * * * *